US012777911B2

(12) United States Patent
Lee et al.

(10) Patent No.: US 12,777,911 B2
(45) Date of Patent: Oct. 27, 2026

(54) INTERCONNECTION STRUCTURE AND METHODS OF FORMING THE SAME

(71) Applicant: TAIWAN SEMICONDUCTOR MANUFACTURING COMPANY, LTD., Hsinchu (TW)

(72) Inventors: Cheng-Chin Lee, Taipei (TW); Hsin-Yen Huang, New Taipei (TW); Yen Ju Wu, Hsinchu (TW); Shao-Kuan Lee, Kaohsiung (TW); Kuang-Wei Yang, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 508 days.

(21) Appl. No.: 18/207,875

(22) Filed: Jun. 9, 2023

(65) Prior Publication Data

US 2024/0413074 A1 Dec. 12, 2024

(51) Int. Cl.
*H10W 20/42* (2026.01)
*H10W 20/00* (2026.01)

(52) U.S. Cl.
CPC ......... *H10W 20/42* (2026.01); *H10W 20/033* (2026.01); *H10W 20/075* (2026.01); *H10W 20/095* (2026.01)

(58) Field of Classification Search
CPC ......... H01L 21/76828; H01L 21/76807; H01L 21/76831; H01L 23/5226; H01L 21/76834; H01L 23/5329; H01L 23/53295; H10W 20/42; H10W 20/033; H10W 20/075; H10W 20/095; H10W 20/0372; H10W 20/077; H10W 20/034; H10W 20/037; H10W 20/096; H10W 20/425; H10W 20/47; H10W 20/435
See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |

(Continued)

FOREIGN PATENT DOCUMENTS

TW 202310057 A 3/2023

*Primary Examiner* — Thanhha S Pham
(74) *Attorney, Agent, or Firm* — NZ Carr Law Office

(57) ABSTRACT

A method for forming a semiconductor device structure is disclosed. The method includes forming one or more first conductive features in a first dielectric layer, forming a metal layer on each of the one or more first conductive features, forming a first etch stop layer over the metal layer, forming a second etch stop layer on the first etch stop layer, wherein the second etch stop layer is a nitrogen-free layer. The method also includes forming a second dielectric layer on the second etch stop layer, and forming a second conductive feature in the second dielectric layer through the second etch stop layer, the first etch stop layer, and the metal layer.

20 Claims, 27 Drawing Sheets

FIG. 5M-1 to 5M-4

(56) References Cited

U.S. PATENT DOCUMENTS

| | | | | |
|---|---|---|---|---|
| 9,859,386 | B2 | 1/2018 | Ho et al. | |
| 2021/0057273 | A1 | 2/2021 | Chen et al. | |
| 2021/0098290 | A1* | 4/2021 | Hsueh | H01L 21/76831 |
| 2022/0285210 | A1* | 9/2022 | Lin | H01L 21/76813 |

* cited by examiner (Alternative Embodiment)

(Alternative Embodiment)

(Alternative Embodiment)

(Alternative Embodiment)

(Alternative Embodiment)

(Alternative Embodiment)

INTERCONNECTION STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. For example, as the aspect ratio of conductive features in the dielectric material in the back-end-of-line (BEOL) interconnection structure gets higher, electrical resistivity increase. Therefore, improved interconnection structures are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3D-1 is a cross-sectional view of a portion of the interconnect structure shown in FIG. 3D, in accordance with some embodiments.

FIGS. 3D-2 is a cross-sectional view of a portion of the interconnect structure shown in FIG. 3D, in accordance with some embodiments.

FIGS. 3I-1-3I-4 are enlarged views of a portion of the interconnect structure shown in FIG. 3H, in accordance with some embodiments.

FIG. 4D-1 illustrates a cross-sectional view of a portion of the interconnect structure shown in FIG. 4D, in accordance with some embodiments.

FIGS. 4I-1-4I-2 are enlarged views of a portion of the interconnect structure shown in FIG. 4H, in accordance with some embodiments.

FIGS. 5E-1 and 5E-2 are cross-sectional views of a portion of the interconnect structure shown in FIG. 5E, in accordance with some embodiments.

FIGS. 5D-1 and 5D-2 illustrate the interconnect structure subjecting to a treatment process, in accordance with some embodiments.

FIGS. 5M-1-5M-4 are enlarged views of a portion of the interconnect structure shown in FIG. 5L, in accordance with some embodiments.

DETAILED DESCRIPTION

Figure 1A:
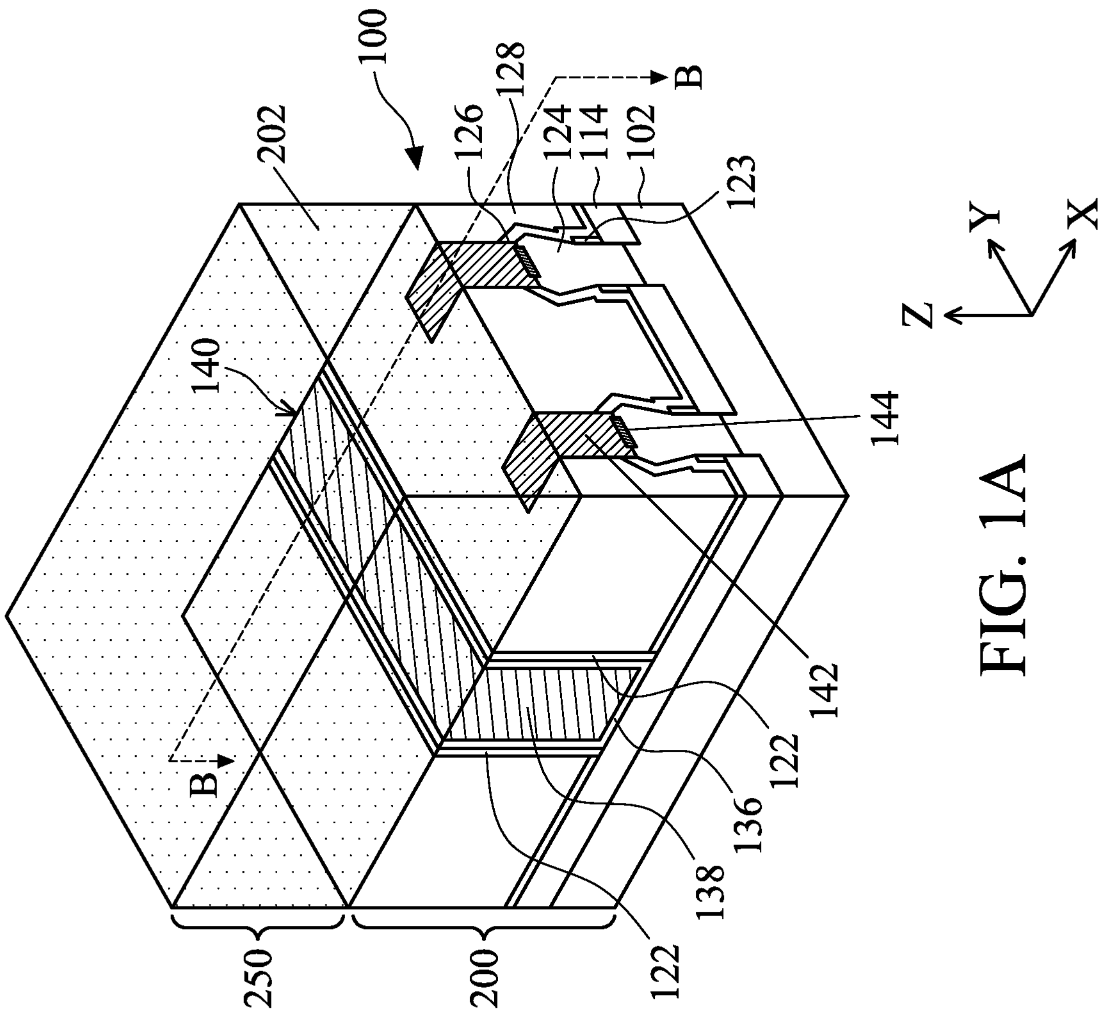
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below;" "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
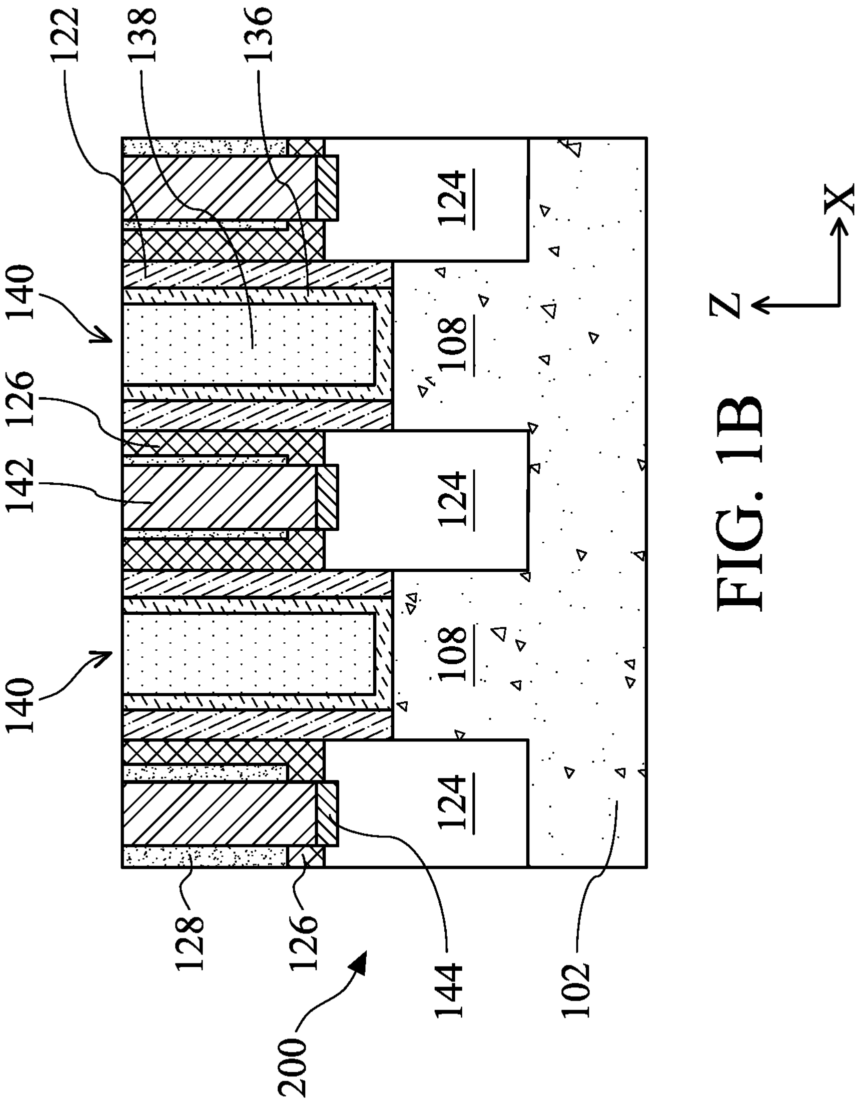
FIG. 1B is a cross-sectional side view of the stage of manufacturing the semiconductor device structure taken along line B-B of FIG. 1A, in accordance with some embodiments.

FIG. 1A illustrates a stage of manufacturing a semiconductor device structure 100 including a device layer 200 and an interconnect structure 250. FIG. 1B illustrates a cross-sectional view of the device layer 200 in accordance with some embodiments. The device layer 200 includes a substrate 102 and one or more devices formed in or on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the device layer 200 may include any suitable devices, such as transistors, diodes, imaging sensors, resistors, capacitors, inductors, memory cells, or a combination thereof. In some embodiments, the device layer 200 includes transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device formed on the substrate 102 is a FinFET, which is shown in FIGS. 1A and 1B. The device layer 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. As shown in FIG. 1B, two gate stacks 140 are formed on the substrate 102. In some embodiments, more than two gate stacks 140 are formed on the substrate 102. While not shown, channel regions are formed between the S/D regions 124 and have at least three surfaces wrapped around by the gate stack 140.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions may include one or more semiconductor materials, such as Si, Ge, GeSn, SiGe, GaAs, InSb, GaP, GaSb, InAlAs, InGaAs, GaSbP, GaAsSb, GaN, GaP, or InP. The channel regions may include the same semiconductor material as the substrate 102. In some embodiments, the device layer 200 may include FinFETs, and the channel regions are a plurality of fins disposed below the gate stacks 140. In some embodiments, the device layer 200 may include nanostructure transistors, and the channel regions are surrounded by the gate stacks 140.

As shown in FIGS. 1A and 1B, each gate stack 140 includes a gate electrode layer 138 disposed over the channel region (or surrounding the channel region for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. The gate stack 140) may further include a gate dielectric layer 136 disposed over the channel region. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for ease of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layer 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique. In some embodiments, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

A contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

S/D contacts 142 may be disposed in the ILD layer 128 and over the S/D region 124. The S/D contacts 142 may be electrically conductive and include a material having one or more of Ru, Mo, Co, Ni, W, Ti, Ta, Cu, Al, TiN or TaN, and the conductive contact may be formed by any suitable method, such as electro-chemical plating (ECP), or PVD. A silicide layer 144 may be disposed between the S/D contacts 142 and the S/D region 124. The silicide layers 144 may be made of a metal or metal alloy silicide, and the metal includes a noble metal, a refractory metal, a rare earth metal, alloys thereof, or combinations thereof.

In integrated circuits, interconnection structures (or interconnect structures) are used to provide signal routing and power supply to semiconductor devices. An integrated circuit chip typically includes a device layer, fabricated during front-end-of-line (FEOL) and middle-end-of-line (MEOL) processes, and a back-end-of-line (BEOL) layer. The device layer may be formed in and/or on the substrate, and the BEOL layer is formed on a front side and/or backside of the device layer. The device layer may include various semiconductor devices, such as transistors, diodes, capacitors, resistors, etc., and may be formed in and/or on the substrate. In some embodiments, the device layer may also include the MEOL structures, such as one or more dielectric layers with conductive features connected to gates and source/drain features in the device layer. Interconnection structures typically include conductive lines and vias formed in both the device layer and the BEOL layers.

Figure 2:
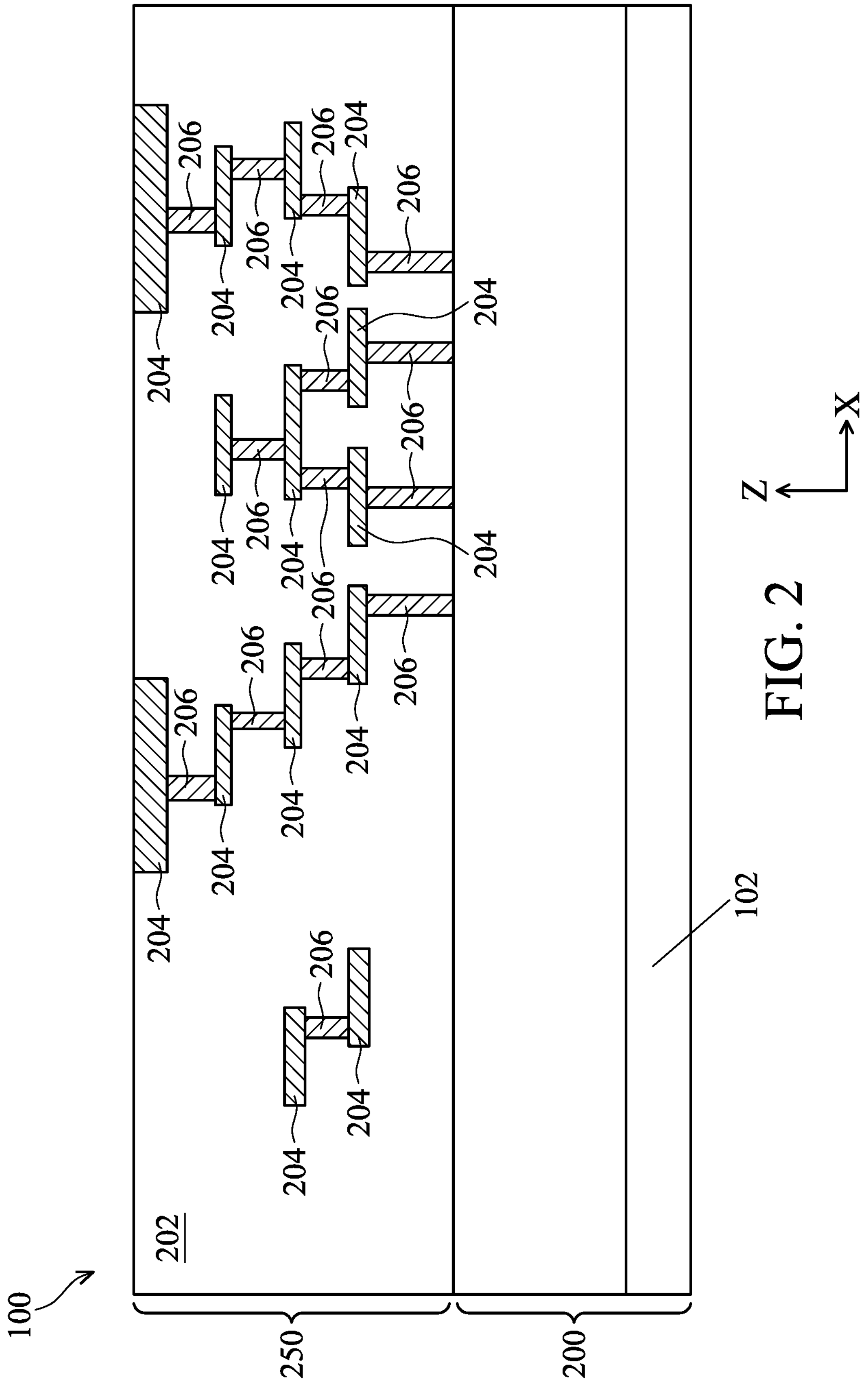
FIG. 2 is a cross-sectional side view of a stage of manufacturing the semiconductor device structure, in accordance with some embodiments.

FIG. 2 is a cross-sectional side view of a stage of manufacturing the semiconductor device structure 100, in accordance with some embodiments. The interconnect structure 250 is disposed over the device layer 200 and the substrate 102. The interconnect structure 250 includes various conductive features, such as a first plurality of conductive features 204 and second plurality of conductive features 206, and an intermetal dielectric (IMD) layer 202 to separate and isolate various conductive features 204, 206. In some embodiments, the first plurality of conductive features 204 are conductive lines and the second plurality of conductive features 206 are conductive vias. The interconnect structure 250) includes multiple levels of the conductive features 204, and the conductive features 204 are arranged in each level to provide electrical paths to the device layer 200 disposed below. The conductive features 206 provide vertical electrical routing from the device layer 200 to the conductive features 204 and between conductive features 204. For example, the bottom-most conductive features 206 of the interconnect structure 250 may be electrically connected to the conductive contacts disposed over the S/D regions 124 (FIGS. 1A and 1B) and the gate electrode layer 138 (FIGS. 1A and 1B). The conductive features 204 and conductive features 206 may be made from one or more electrically conductive materials, such as metal, metal alloy, metal nitride, or silicide. For example, the conductive features 204 and the conductive features 206 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, a backside interconnection structure (not shown), similar to the interconnect structure 250, may be formed on the backside of the device layer 200 to provide power supply and/or additional signal connection to the device layer 200.

The IMD layer 202 includes one or more dielectric materials to provide isolation functions to various conductive features 204, 206. The IMD layer 202 may include multiple dielectric layers embedding multiple levels of conductive features 204, 206. The IMD layer 202 is made from a dielectric material, such as $SiO_x$, $SiO_xC_yH_z$, or $SiO_xC_y$, where x, y and z are integers or non-integers. In some embodiments, the IMD layer 202 includes a dielectric material having a k value ranging from about 1 to about 5.

Figure 3B:
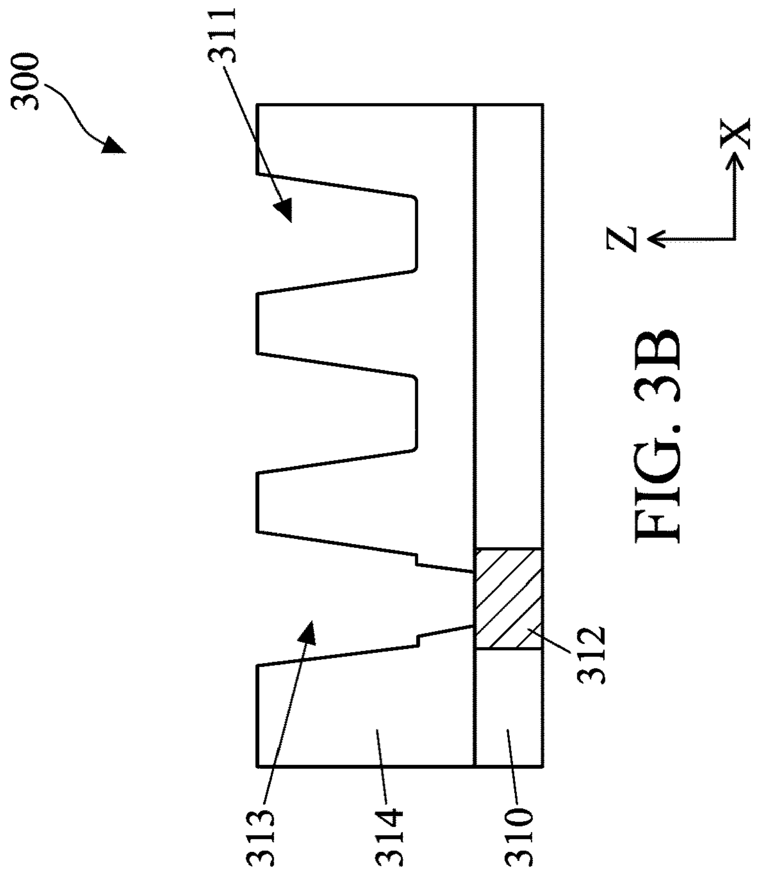
FIGS. 3A-3H are cross-sectional side views of various stages of manufacturing an interconnect structure, in accordance with some embodiments.
Figure 3A:
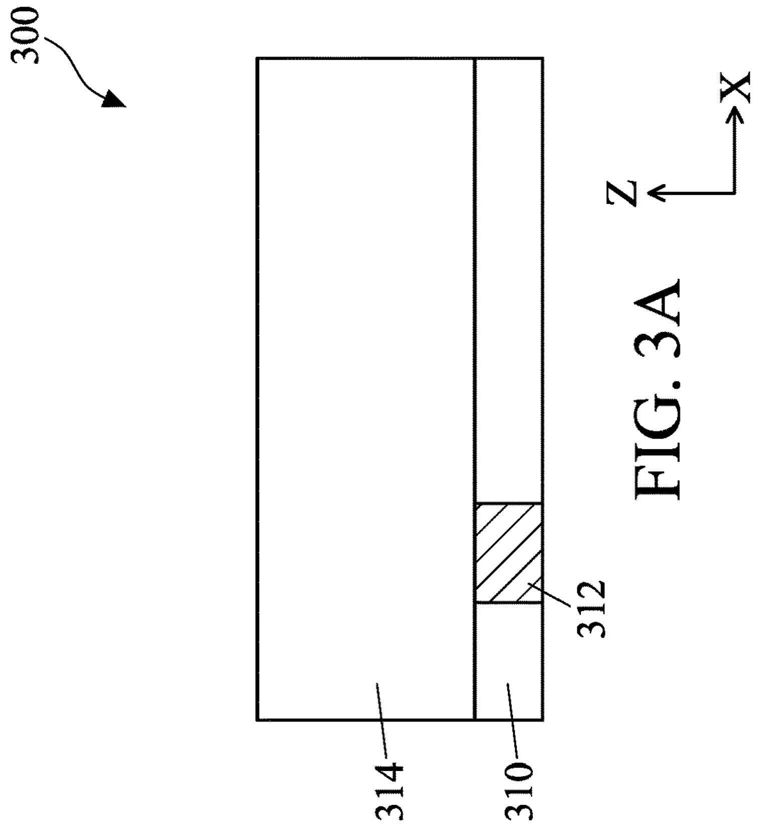

FIGS. 3A-3H are cross-sectional side views of various stages of manufacturing an interconnect structure 300, in accordance with some embodiments. The interconnect structure 300 may be used to form one or more layers of the interconnect structure 250) shown in FIGS. 1A and 1B as well as FIG. 2. As shown in FIG. 3A, the interconnect structure 300 includes a dielectric layer 310 and a dielectric layer 314 disposed on the dielectric layer 310. The dielectric layer 310 may be an ILD layer or an IMD layer. For example, the dielectric layer 310 may be the ILD layer 128 (FIGS. 1A and 1B) or the IMD layer 202 (FIG. 2). The dielectric layer 310 may include the same material as the ILD layer 128 or the IMD layer 202. In some embodiments, the dielectric layer 310 includes a low-k dielectric material having a k value ranging from about 1.5 to about 3.9. In one exemplary embodiment, the dielectric material 310 is SiOCH. The dielectric layer 310 may be formed by CVD, FCVD, ALD, spin coating, or other suitable process. The dielectric layer 314 may include the same material as the dielectric layer 310 and may be formed by the same process as the dielectric layer 310.

The dielectric layer 310 includes one or more conductive features 312 (only one is shown) disposed in the dielectric layer 310. The conductive feature 312 includes an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive feature 312 includes a metal. The conductive feature 312 may be formed by PVD, CVD, ALD, or other suitable process. The one or more conductive features 312 may be electrically connected the S/D regions 124 (FIGS. 1A and 1B) and the gate electrode layer 138 (FIGS. 1A and 1B). In some embodiments, the conductive feature 312 may be the conductive contact disposed in the ILD layer 128 or the conductive feature 204, 206 disposed in the IMD layer 202. For example, the conductive features 312 may be conductive lines or conductive vias as shown in FIG. 2. In some embodiments, the conductive feature 312 may include a barrier layer (not shown) disposed between the dielectric layer 310 and the electrically conductive material of the conductive feature 312. The barrier layer may include an electrically conductive material, such as a metal or metal nitride.

In FIG. 3B, openings 311, 313 are formed in the dielectric layer 314. The openings 311, 313 are intended to be filled with an electrically conductive material to form conductive features (e.g., conductive features 204 or 206) therein. The openings 311, 313 may be via openings or line openings and may be formed as a result of one or more etch processes. For example, the opening 311 may be a via opening and the opening 313 may be a line opening formed by a dual-damascene process or any suitable etch and patterning processes.

Figure 3D:
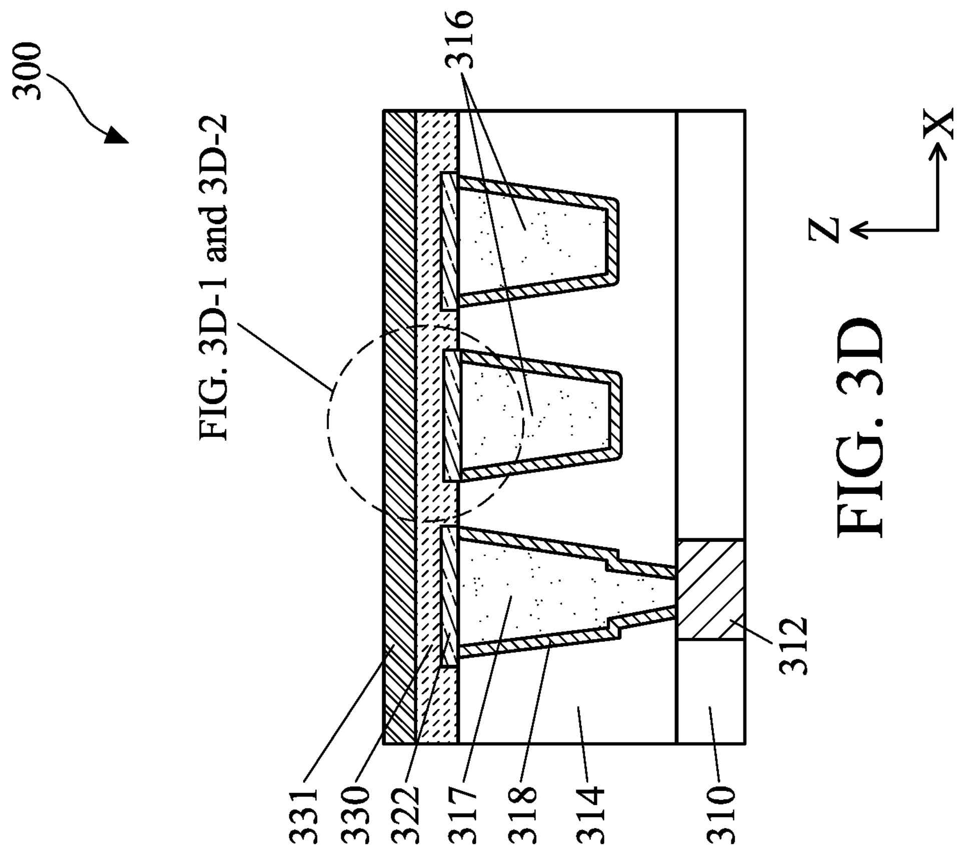
Figure 3C:
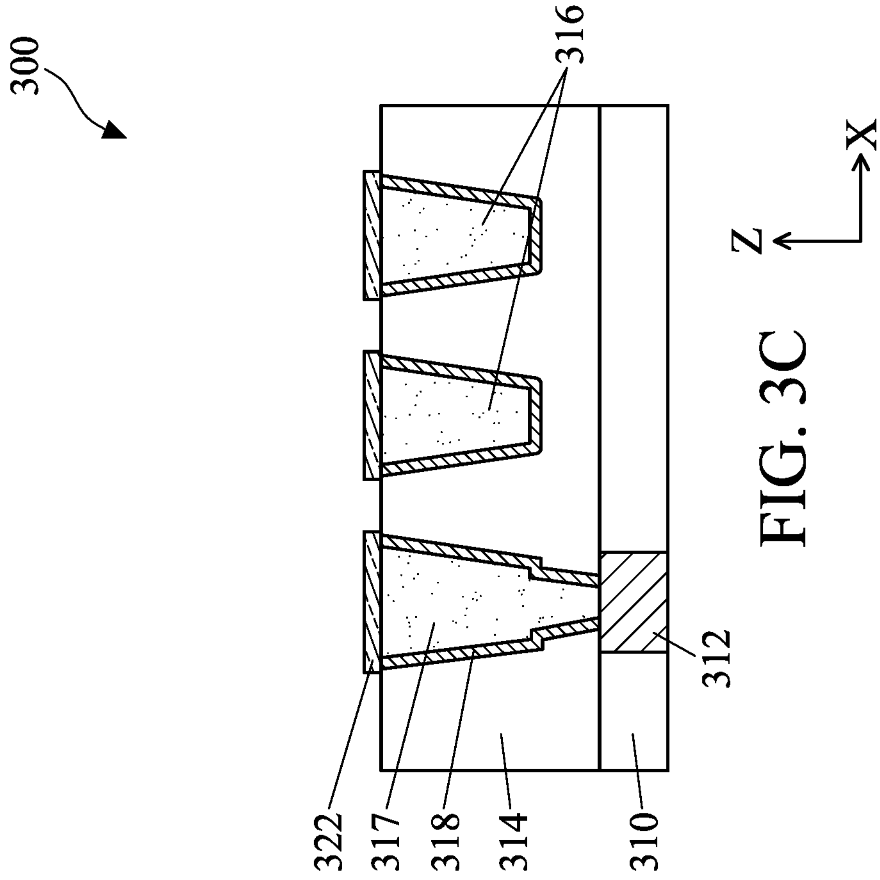

In FIG. 3C, one or more conductive features 316, 317 are formed in the dielectric layer 314 by filling the openings 311, 313 with an electrically conductive material. The conductive features 316, 317 include an electrically conductive material, such as Cu, Co, Al, Ru, Mo, W, Ni, Ti, Zr, Ta, Zn, alloys thereof, or other suitable material. The conductive features 316, 317 may be formed by any suitable process, such as ECP, electroless deposition (ELD), PVD, or CVD. The conductive features 316 may be the conductive feature 206 and the conductive features 317 may be the conductive feature 204. A barrier layer 318 may be formed between the dielectric layer 314 and the conductive features 316, 317. In some embodiments, a liner (not shown) may be formed between the barrier layer 318 and the conductive features 316, 317. The barrier layer 318 and the liner may be formed by any suitable process, such as CVD, PECVD, or ALD. In some embodiments, the barrier layer 318 and the liner (if used) are conformal layers formed by ALD. The barrier layer 318 may include Ta, Ti, Mn, Zn, In, TaN, TiN, or other suitable material. In some embodiments, the conductive features 316, 317 include a metal that is susceptible to diffusion, such as Cu, and the barrier layer 318 may prevent metal diffusion from the conductive features 316, 317 to the dielectric layer 314. The liner, if used, may function as a glue layer, so both the conductive features 316, 317 and the barrier layer 318 are adhered to the liner. In such cases, the liner may include a metal, such as Co. Alternatively, the liner may include the same material as the conductive features 316, 317. In some embodiments, the conductive features 316, 317 include a metal that is not susceptible to diffusion, such as Co, and the barrier layer 318 and the liner may be omitted. In some embodiments, the conductive features 316, 317 located near the top of the interconnect structure 300 do not include the liner, while the conductive features 316, 317 located near the bottom of the interconnect structure 300 include the liner.

After the conductive features 316, 317 are formed in the openings 311, 313, a planarization process, such as a CMP process, is performed until the dielectric layer 314 is exposed. After the planarization process, the top surfaces of the conductive features 316, 317, the barrier layer 318, the liner (if used), and the dielectric layer 314 are substantially co-planar.

A metal layer 322 is then selectively formed on each conductive features 316, 317. In cases where the barrier layer 318 and the liner (if used) include metals, the metal layer 322 is also formed on the barrier layer 318 and the liner. The metal layer 322 includes a metal having relatively higher carbon solubility than the material of the conductive features 316, 317. In some embodiments, the metal layer 322 includes Co, Ni, W, Mo, Ru, and the conductive features 316, 317 includes Cu. The metal layer 322 is selectively formed on the metallic surfaces of the conductive feature 316 and the barrier layer 318, and is not formed on the dielectric surfaces of the dielectric layer 314. For example, the exposed surfaces of the dielectric layer 314 may be first treated with a gas containing hydrophobic functional groups, and the hydrophobic functional groups are formed on the exposed surfaces of the dielectric layer 314. The gas containing hydrophobic functional groups does not react with the metallic surfaces of the barrier layers 318, the liners 320, and the conductive features 316. The hydrophobic functional groups formed on the exposed surfaces of the dielectric layer 314 block the metal layer 322 from forming on the dielectric layer 314.

In FIG. 3D, a first etch stop layer 330 is formed on the dielectric layer 314, the metal layers 322, and the side surfaces of the metal layers 322. The first etch stop layer 330 may include a material that has a low capacitance value or low K value (e.g., 7 or below, such as 4 or below). The use of a low capacitance value or low K value material in the first etch stop layer 330 can help reduce the capacitance of damascene-based interconnects for back-end-of-line (BEOL) technologies without worsening RC delays. It has been observed that the use of low capacitance first etch stop layer 330 can acquire about 3% to about 5% of reduction in capacitance for damascene BEOL interconnect structures. In various embodiments, the first etch stop layer 330 is a metal-free layer. Unlike traditional etch stop layers, which use metal oxide and have increased electrical resistivity due to the inclusion of carbon, the first etch stop layer 330 does not include metal and have lower electrical resistivity compared to the etch stop layers using metal oxide. In some cases, the first etch stop layer 330 has a k value less than 4. Exemplary materials for the first etch stop layer 330 may include, but are not limited to, silicon carbonitride (SiCN), boron nitride (BN), silicon oxycarbonitride (SiOCN), oxygen-doped silicon carbide (SiC), silicon oxycarbide (SiOC), or the like. In some embodiments, the first etch stop layer 330 may be a material comprising a methyl group. The first etch stop layer 330 may be formed by PECVD, PEALD, spin coating, or any suitable deposition process. In one exemplary embodiment, the first etch stop layer 330 is SiCN. In such cases, the first etch stop layer 330 may be deposited by exposing the interconnect structure 300 to a single precursor containing silicon, carbon, and nitrogen, such as hexamethyldisilazane (HDMS). Alternatively, the first etch stop layer 330 may be deposited by exposing the interconnect structure 300 to multiple precursors, such as a silicon-containing precursor (e.g., silane), a nitrogen-containing precursor (e.g., $NH_3$), and a carbon-containing precursor (e.g., $CH_4$, $C_2H_2$, benzene, etc.).

Next, a second etch stop layer 331 is formed on the first etch stop layer 330. The second etch stop layer 331 is selected to have an etch selectivity different from that of the first etch stop layer 330. The second etch stop layer 331 functions as a moisture blocking layer, which prevents the conductive features 316, 317 from being oxidized during the subsequent processes. Similar to the first etch stop layer 330, the second etch stop layer 331 is also a metal-free layer. In some cases, the second etch stop layer 331 has a k value less than 4. In some embodiments, the second etch stop layer 331 does not contain nitrogen (i.e., a nitrogen-free layer). In some embodiments, the second etch stop layer 331 includes carbon. In some embodiments, the second etch stop layer 331 includes silicon and carbon. In some embodiments, the second etch stop layer 331 includes silicon and oxygen. In some embodiments, the second etch stop layer 331 includes silicon, oxygen, and carbon. One exemplary material for the second etch stop layer 331 is $SiO_xC_y$, wherein x is from about 0.5 to about 2.4 and y is from about 0.6 to about 3. The second etch stop layer 331 may be formed by PECVD, PEALD, thermal ALD, or any suitable deposition process.

Figures 1, 3D:
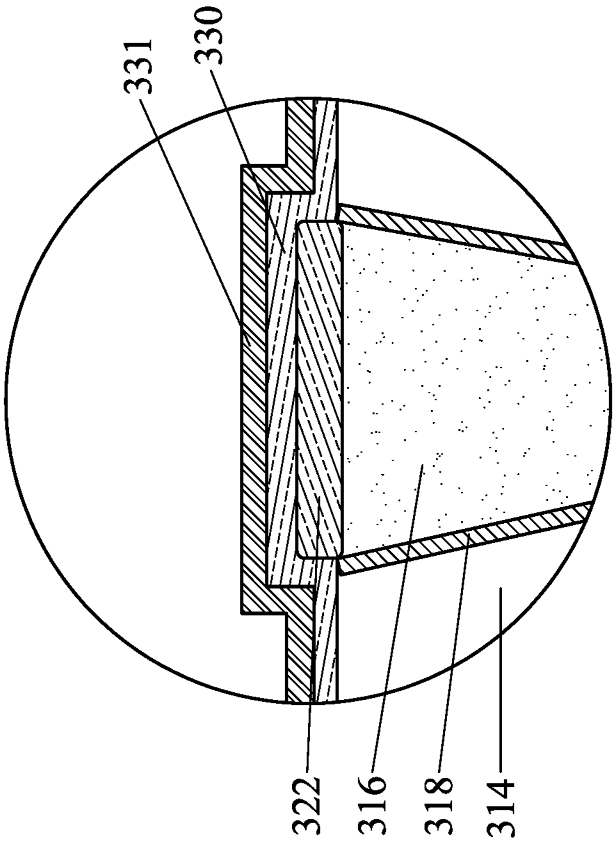
Figures 2, 3D:
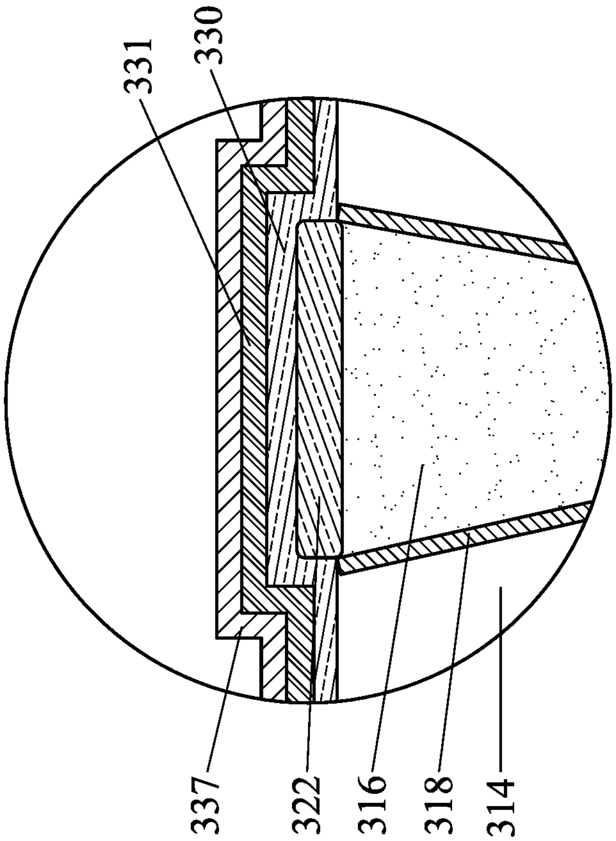

In some embodiments, the first and second etch stop layers 330, 331 are conformal layers formed by an ALD-based deposition process. In such cases, the first and second etch stop layers 330, 331 may have a profile that follows the profile of the metal layers 322. FIG. 3D-1 illustrates a cross-sectional view of a portion of the interconnect structure 300 showing the first and second etch stop layers 330, 331 formed by an ALD-based deposition process. In either case, the thickness of the first etch stop layer 330 and the thickness of the dielectric layer 314 may be at a ratio of about 1:3 to about 1:15. The thickness of the second etch stop layer 331 and the thickness of the dielectric layer 314 may be at a ratio of about 1:3 to about 1:15. In some embodiments, the first and second etch stop layers 330, 331 may each have a thickness in a range of about 50 Å to about 200 Å, for example about 100 Å. In one exemplary embodiment, the first etch stop layer 330 has a thickness of about 90 Å and the dielectric layer 314 has a thickness of about 330 Å.

In some alternative embodiments, which can be combined with any other embodiment(s) of this disclosure, a third etch stop layer 337 may be deposited on the second etch stop layer 331, as shown in FIG. 3D-2. The third etch stop layer 337 may include an oxide or a nitride of a semiconductor, such as silicon. The third etch stop layer 337 may be formed by any suitable process, such as CVD or ALD. In some embodiments, the third etch stop layer 337 may be disposed between the first etch stop layer 330 and the second etch stop layer 331.

Figure 3F:
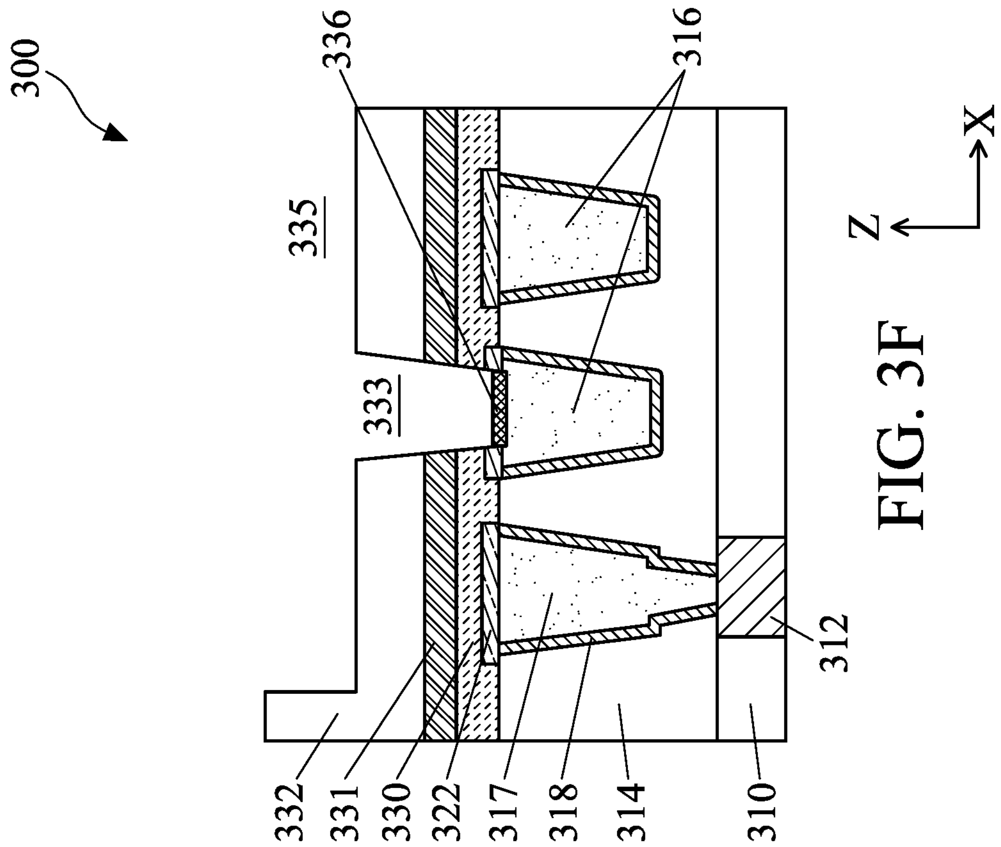
Figure 3E:
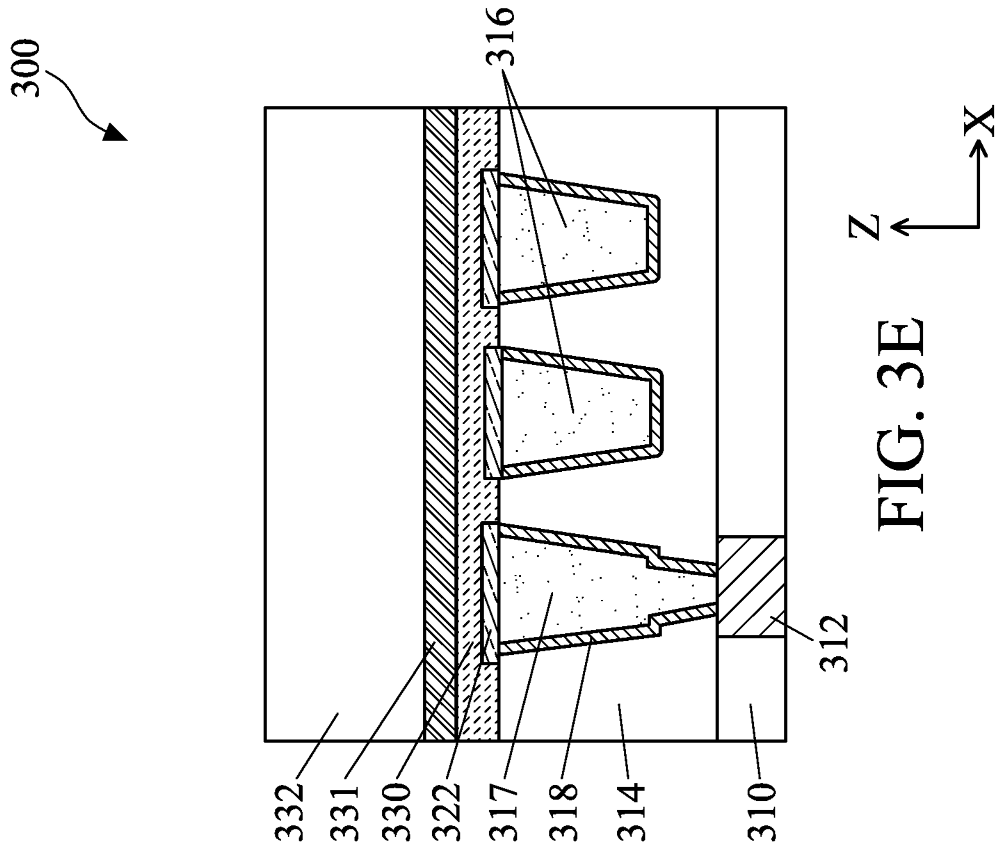

In FIG. 3E, a dielectric layer 332 is formed on the second etch stop layer 331. In some embodiments, the dielectric layer 332 includes the same material as the dielectric layer 314 and is formed by the same process as the dielectric layer 314.

In FIG. 3F, openings 333, 335 are formed in and through the dielectric layer 332. The opening 335 may be a trench opening formed in an upper portion of the dielectric layer 332. The opening 333 is disposed over at least one of the conductive features 316. The opening 333 may be a via opening formed through the dielectric layer 332, the second etch stop layer 331, the first etch stop layer 330, and the metal layer 322 to expose a portion of the conductive feature 316. The openings 333, 335 are intended to be filled with a conductive material to form conductive features therein. The openings 333, 335 may be formed by any suitable process, such as one or more etch processes. In some embodiments, the openings 333, 335 are a result of a dual-damascene process. The etch processes remove a portion of the second etch stop layer 331, the first etch stop layer 330, and the metal layer 322 so that the opening 333 exposes a portion of a top surface of the corresponding conductive feature 316.

Next, a blocking layer 336 is selectively formed on the exposed top surface of the conductive feature 316. In some embodiments, the blocking layer 336 may be formed by exposing the top surface of the conductive feature 316 to a blocking agent through the use of CVD, ALD, wet coating, immersion process, or other suitable methods. The blocking agent may include one or more inhibitors configured to selectively attach to the metallic surface of the conductive feature 316. Suitable inhibitors may include, but are not limited to, bezotriazole ($C_6H_5N_3$), benzimidazole ($C_7H_6N_2$), tolyltriazole ($C_7H_7N_3$), oxalic acid ($C_2H_2O_4$), malonic acid ($C_3H_4O_4$), citric acid ($C_6H_8O_7$), lactic acid ($C_3H_6O_3$), ethylenediaminetetraacetic acid ($C_{10}H_{16}N_2O_8$), tetraacetic acid ($C_{14}H_{24}N_2O_{10}$), pentetic acid ($C_{14}H_{23}N_3O_{10}$), and nitrilotriacetic acid ($C_6H_9NO_6$), or the like. In other embodiments, the blocking agent may include inorganic inhibitors, such as chromates, nitrites, molybdates and phosphates, and the cathodic type inhibitors, such as zinc and polyphosphate inhibitors.

In some embodiments, the blocking layer 336 may be organic material including small molecule or polymer. The blocking layer 336 may include one or more self-assembled monolayers (SAMs) having a head group and a tail group. The head group of the SAM may be selected depending on the material of the conductive feature 316. For example, the head group of the SAM may include an azole group-containing compound when Cu or Co is used as the conductive feature 316, or a compound terminated with an alkyne group when Ru is used as the conductive feature 316. In some embodiments, the head group of the SAM may include a phosphorus (P), sulfur(S), silicon (Si), or nitrogen (N) terminated compound which may only attach to the metallic surfaces of the conductive features 316. The head group of the SAM may not form on the dielectric surface of the dielectric layer 332 and the first and second etch stop layers 330, 331. The tail group of the SAM may include a highly hydrophobic long alkyl chain which blocks adsorption of a precursor (e.g., precursor for forming the subsequent barrier layer 338) from forming on the blocking layer 336. In some embodiments, the tail group includes a polymer such as polyimide. The blocking layer 336 may be formed by supplying a blocking agent to the exposed surfaces, for example by CVD, ALD, molecular layer deposition (MLD), wet coating, immersion process, or other suitable methods.

In some embodiments, the blocking layer 336 is formed by a wet-coating process, and the solution for wet coating may be a protic organic solvent such as alcohols, carboxylic acids, or a combination thereof. Exemplary protic organic solvents may include, but are not limited to, methanol, ethanol, 1-propanol, 2-propanol, 1-butanol, 1-pentanol, 1-hexanol, 1-heptanol, 2-ethoxyethanol, and mixtures thereof. The solution for wet coating may also be a polar or nonpolar protic solvent. Exemplary polar aprotic solvents may include, but are not limited to, N,N-dimethylformamide, N-methyl-2-pyrrolidinone, acetonitrile, acetone, ethyl acetate, benzyl ether, trioctylphosphine, trioctylphosphine oxide, and mixtures thereof. Exemplary nonpolar protic solvents may include, but are not limited to, alkane, olefin, an aromatic, an ester or an ether solvent, hexane, octane, benzene, toluene, xylene, and mixtures thereof.

Figure 3H:
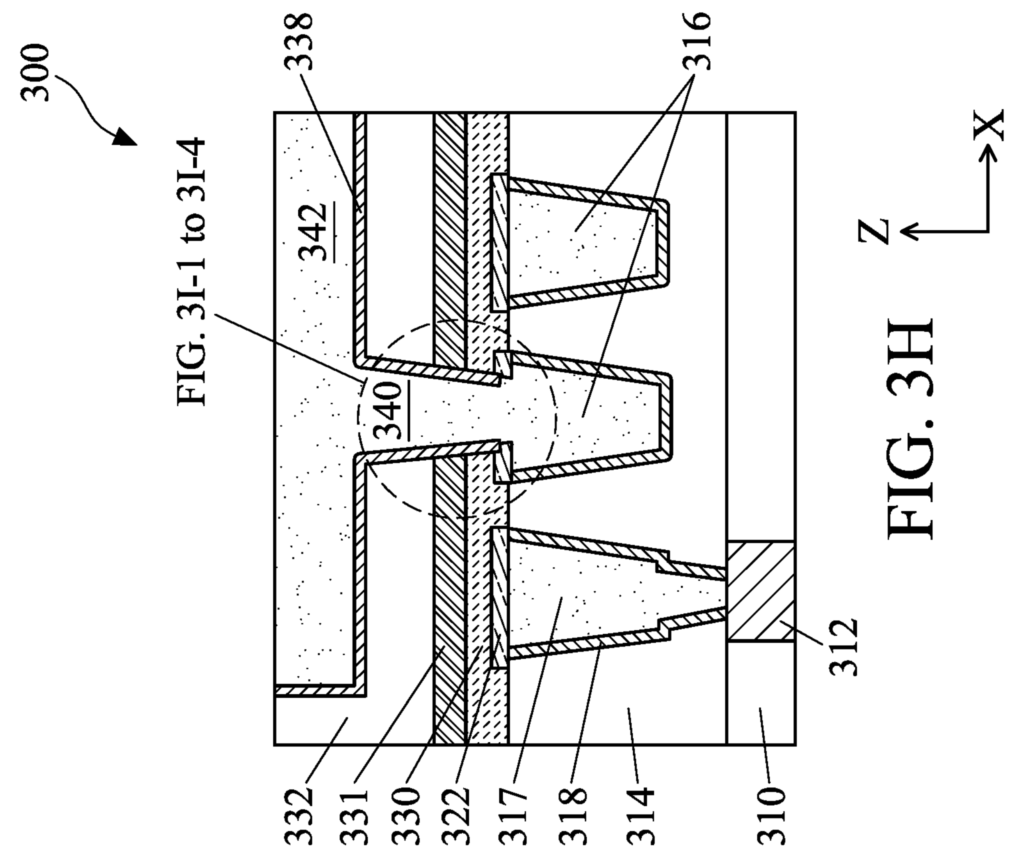
Figure 3G:
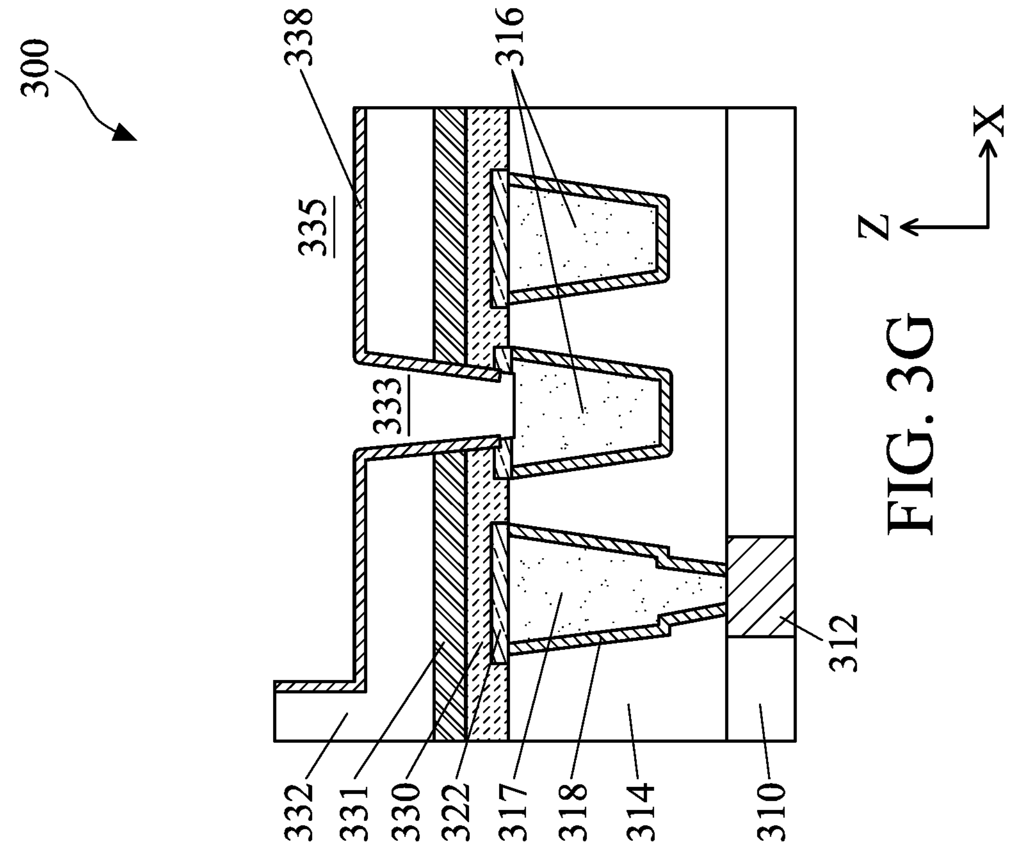

In FIG. 3G, a barrier layer 338 is deposited on exposed dielectric surfaces, such as the dielectric layer 332, the second etch stop layer 331, the first etch stop layer 330. The barrier layer 338 serves to prevent the metal diffusion from the subsequent conductive features 340, 342 to the dielectric layer 332. With the blocking layer 336 (FIG. 3F) formed on the metallic surfaces of the conductive features 316, the barrier layer 338 is selectively formed on/over the dielectric layer 332 and the first and second etch stop layers 330, 331 and not formed on the blocking layer 336. The selective deposition of the barrier layer 338 is achieved through the use of the blocking layer 336. For example, the blocking layer 336 may block the barrier layer 338 from forming on the metallic surface of the conductive feature 316. Specifically, the blocking layer 326 blocks the precursor(s) of the barrier layer 328 from forming thereon, so the precursor(s) of the barrier layer 338 grows on the dielectric surfaces, such as the surfaces of the dielectric layer 332 and the first and second etch stop layers 330, 331. The selective deposition of the barrier layer 338 can also be achieved and/or enhanced through the use of ALD process and/or MLD process so that the barrier layer 338 has the characteristic or property of being specific in bonding with the dielectric layer 332 and the first and second etch stop layers 330, 331 through self-limiting surface reactions. The barrier layer 338 may include the same material as the barrier layer 318 and may be formed by a conformal process, such as ALD.

In some embodiments, a liner (not shown) may be formed on the barrier layer 338 to help adhesion of the subsequent conductive features 340, 342 to the barrier layer 338. Since the barrier layer 338 includes metallic material, the liner can be selectively formed on the metallic surface of the barrier layer 338 instead of the organic material or polymer used by the blocking layer 336. If used, the liner may include the same material as the liner used between the conductive feature 317 and the barrier layer 318, and may be formed by a conformal process, such as ALD.

After the barrier layer 338 is deposited, the blocking layer 336 is removed to expose the top surface of the conductive features 316. The blocking layer 336 may be removed using thermal degradation or plasma bombardment, or other suitable process. The removal process does not substantially affect the barrier layer 338 or the conductive feature 316.

In FIG. 3H, a conductive via 340 and a conductive line 342 are formed in the openings 333, 335 (FIG. 3G), respectively. The conductive via 340 and conductive line 342 may be formed by filling a conductive material in the openings 333, 335. The conductive via 340 and conductive line 342 may include any suitable conductive material, such as Cu, Ru, W, Ni, Al, Co, iridium (Ir), osmium (Os), gold (Au), palladium (Pd), platinum (Pt), silver (Ag), tantalum (Ta), titanium (Ti), or alloys thereof. The conductive via 340 and conductive line 342 may be deposited using PVD, CVD, ALD, electroplating, ELD, or other suitable deposition process, or combinations thereof, and followed by a planarization process, such as a CMP process. The interconnect structure 300 includes conductive via 340 and conductive line 342 formed in the dielectric layer 332. The conductive via 340 may have a first dimension and the conductive line 342 may have a second dimension greater than the first dimension. The conductive via 340 is in direct contact with the underlying conductive features 316 in the dielectric layer 314. The conductive via 340 being in direct contact with the conductive feature 316 may have the lowest electrical resistance due to direct metal to metal contact. In addition, since there is no barrier layer or liner layer between the conductive via 340 and the conductive feature 316, the contact resistance between the conductive via 340 and the conductive feature 316 is reduced. Furthermore, the use of low capacitance material for the first etch stop layer 330 can further reduce the capacitance of damascene BEOL structures to avoid high RC delay.

Figures 2, 3I:
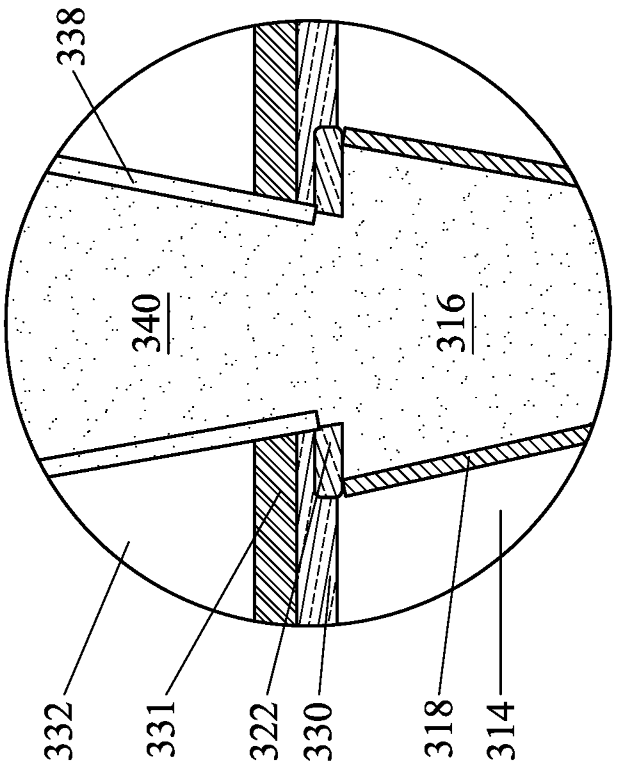
Figures 1, 3I:
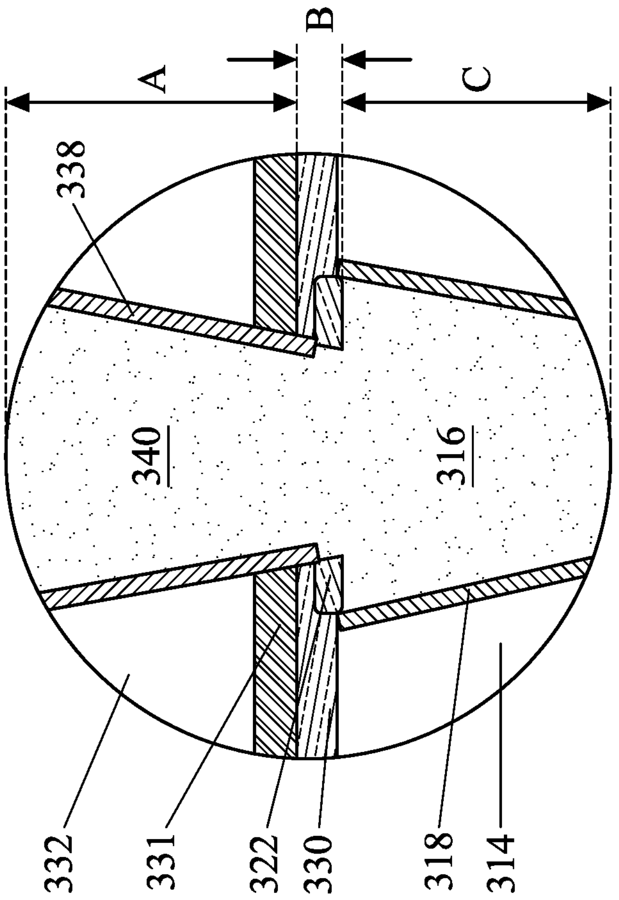

FIGS. 3I-1-3I-4 are enlarged views of a portion of the interconnect structure 300 in accordance with some embodiments. In FIG. 3I-1, the sidewalls of the conductive via 340 and the conductive features 316 may be vertical or slanted. In one embodiment, the conductive via 340 and the conductive feature 316 each has a sidewall profile in which the dimension is gradually decreased along the Z-direction. For example, the dimension at the top of each of the conductive via 340 and the conductive feature 316 is greater than the dimension at the bottom of the conductive via 340 and the conductive feature 316. The conductive via 340 may be considered as having a section A and a section B. The section A has a dimension gradually changing from a first width to a second width. The section B has a dimension gradually changing from a third width to a fourth width. The first width is greater than the second width, the third width is greater than the fourth width. The third width is greater than the second width, and the first width is greater than the fourth width. The conductive feature 316 may be considered as a section C having a dimension gradually changing from a fifth width to a sixth width. The fifth width is greater than the sixth width, and the fifth width is greater than the fourth width. The fifth width may be greater or smaller than the first width.

As shown in FIG. 3I-1, the metal layer 322 is embedded within the first etch stop layer 330 and in contact with the conductive via 340 and the conductive feature 316. The metal layer 322 is disposed to surround the section B of the conductive via 340 and in contact with a portion of the top surface of the conductive feature 316. The metal layer 322 does not in contact with the barrier layer 318 and the barrier layer 338. The barrier layer 318 is in contact with the conductive feature 316, the dielectric layer 314, and the first etch stop layer 330. The barrier layer 338 is in contact with the dielectric layer 332, the conductive via 340, the first etch stop layer 330, and the second etch stop layer 331. Depending on the thickness of the blocking layer 336 (FIG. 3F), the barrier layer 338 may be in further contact with the metal layer 322. In some embodiments, the conductive via 340 and the conductive line 342 may include a first conductive material and the conductive feature 316 may include a second conductive material that is different than the first conductive material.

Figures 3, 3I:
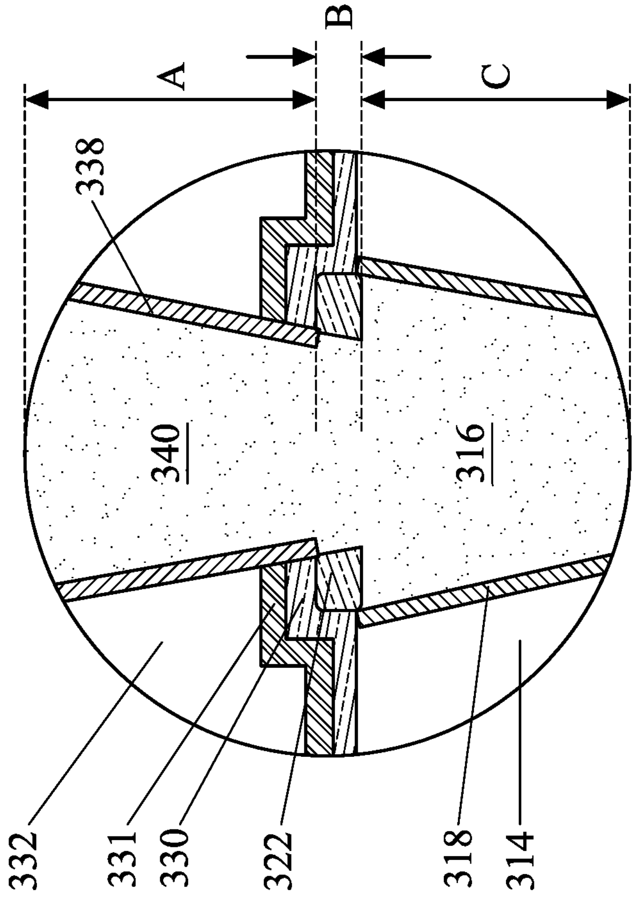
Figures 3, 3I, 4:
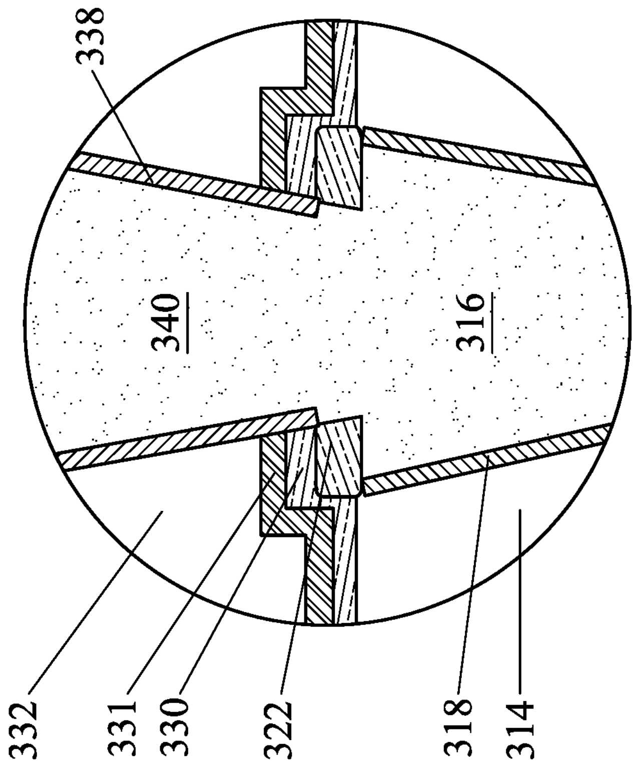

FIG. 3I-2 is substantially identical to the embodiment of FIG. 3I-1 except that the metal layer 322 further extends over and in contact with the barrier layer 318. FIGS. 3I-3 and 3I-4 are substantially identical to the embodiments of FIGS. 3I-1 and 3I-2 except that portions of the first etch stop layer 330 and the second etch stop layer 331 follow the profile of the metal layer 322.

Figure 4B:
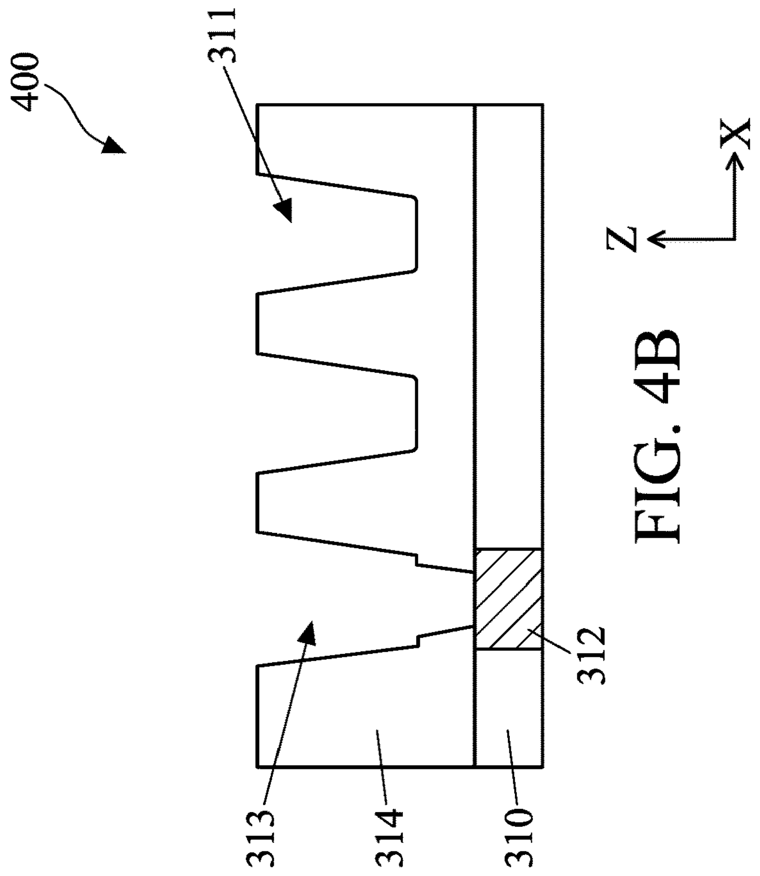
FIGS. 4A-4H are cross-sectional side views of various stages of manufacturing an interconnection structure, in accordance with some embodiments.
Figure 4A:
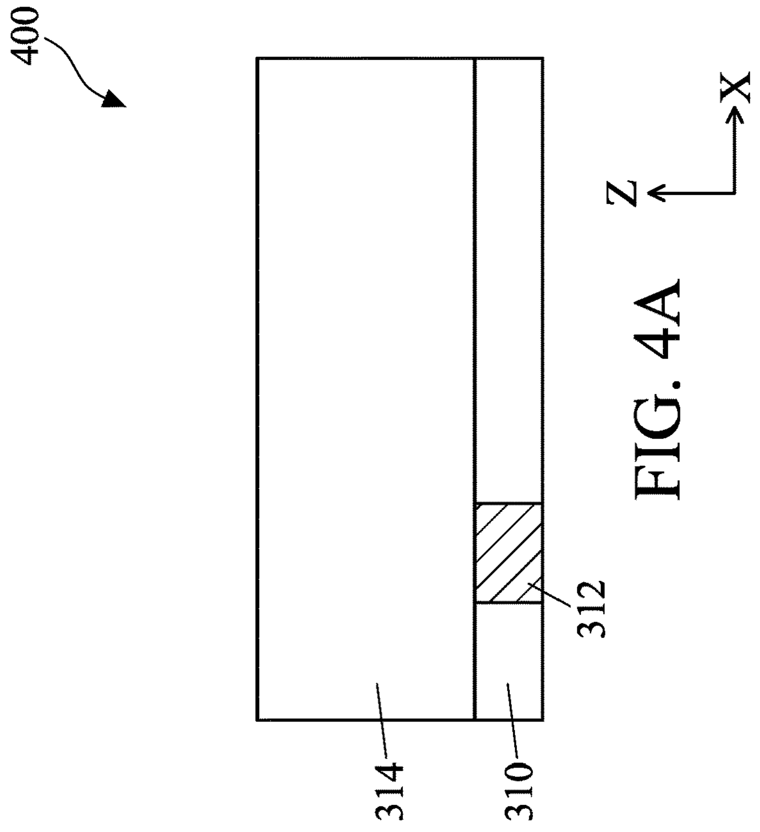
Figure 4D:
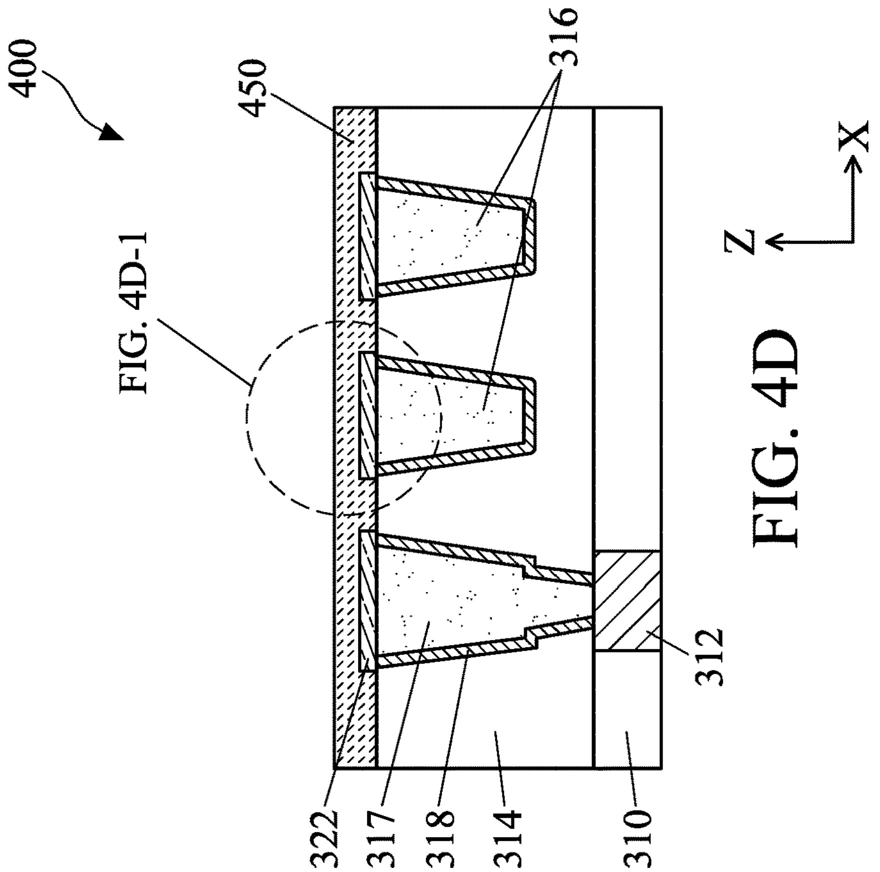
Figure 4C:
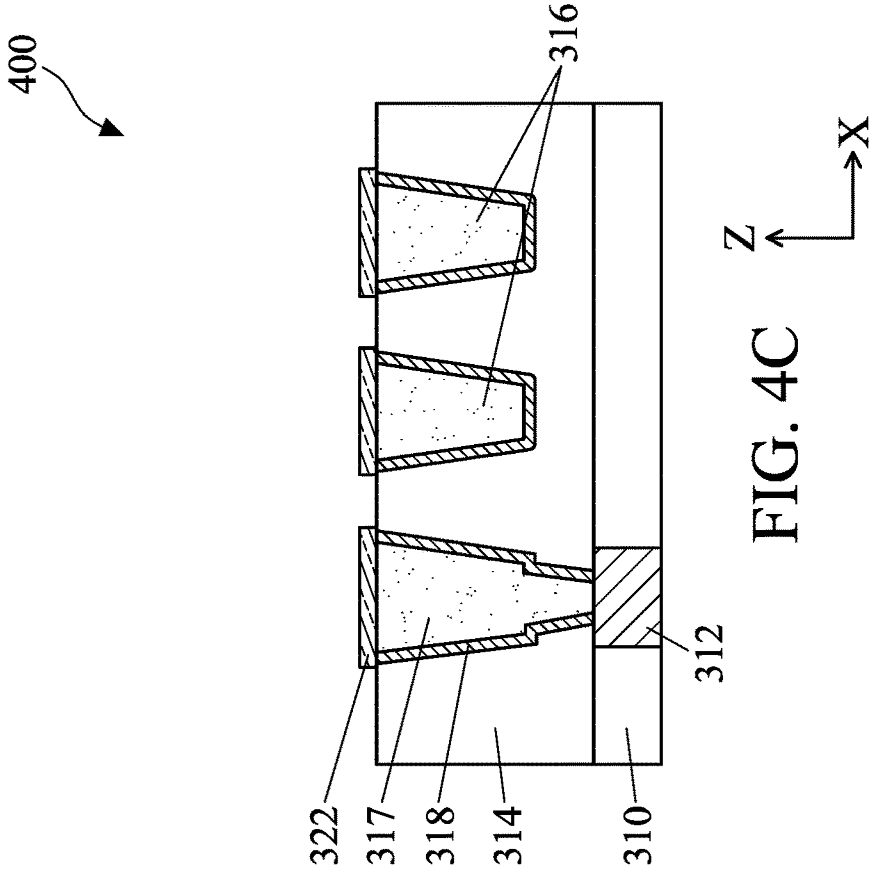
Figures 1, 4D:
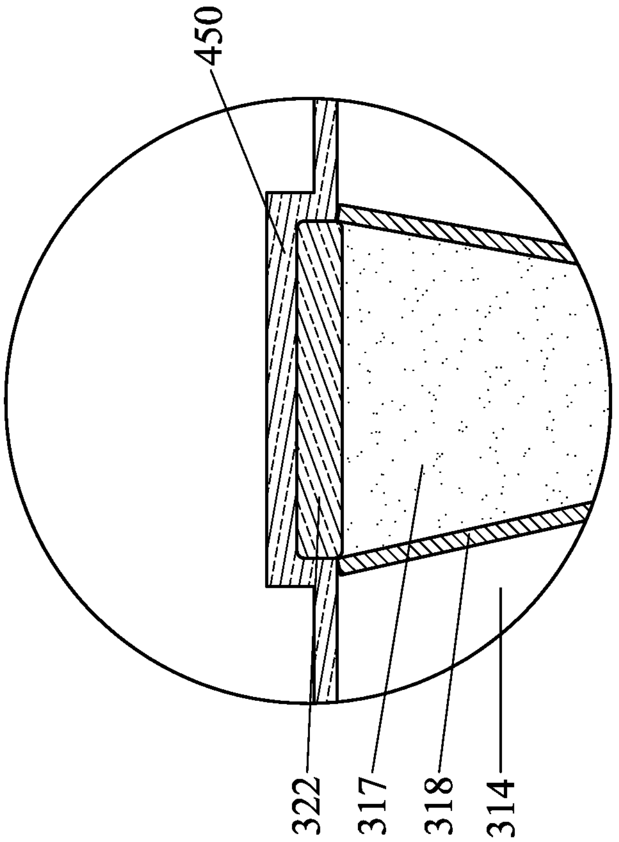

FIGS. 4A-4H are cross-sectional side views of various stages of manufacturing an interconnect structure 400, in accordance with some embodiments. Various embodiments of the interconnect structure 400 may be used to form one or more layers of the interconnect structure 250) shown in FIGS. 1A, 1B and 2. As will be discussed in more detail below; the embodiment shown in FIGS. 4A-4H is similar to the embodiment shown in FIGS. 3A-3H except that a pre-layer 450 is formed between the dielectric layer 314 and the first etch stop layer 330 to improve adhesion between the first etch stop layer 330 and the metal layer 322. The interconnect structure 400 in FIGS. 4A-4C are substantially identical to the interconnect structure 300 shown in FIGS. 3A-3C and therefore are not repeated here for the sake of brevity.

In FIG. 4D, a pre-layer 450 is deposited on the dielectric layer 314, the metal layers 322, and the side surfaces of the metal layers 322. The pre-layer 450 serves as a glue layer that improves the adhesion between the first etch stop layer 330 and the metal layer 322, thereby minimizing or preventing voids from forming at an interface between the first etch stop layer 330 and the metal layer 322. The pre-layer 450 can help remove the voids so that the subsequent conductive features (e.g., conductive via 340) does not land on the voids that may otherwise appear at and/or near the metal layer 322 due to poor adhesion, which in turn improves the yield of the device. In some embodiments, the pre-layer 450 is a nitrogen-rich layer. For example, the nitrogen content in the pre-layer 450 may be in a range of about 40 at. % to about 80 at. %. A nitrogen-rich pre-layer 450 can further reduce capacitance for damascene BEOL interconnect structures while improving the reliability, such as the time-dependent dielectric breakdown (TDDB) and voltage breakdown (VBD) of the semiconductor device. In some embodiments, the pre-layer 450 may be a nitride of a metal, such as Al, Ti, Zr, Hf, Y, or other suitable metal. In some embodiments, the pre-layer 450) includes a nitride of a semiconductor, such as silicon. The pre-layer 450 may be formed by any suitable process, such as PVD, ALD, or CVD. In one exemplary embodiment, the pre-layer is AlN (or AlON) formed at a process temperature less than about 400 degrees Celsius using a precursor that includes an aluminum-based chemical, such as trimethylaluminium (TMA), triethylaluminium (TEAl), aluminum borohydride trimethylamine (AlBT), or other suitable Al-containing chemical or a combination thereof, a nitrogen-based chemical, such as $NH_3$, $N_2$ or other suitable nitrogen-containing chemical or a combination thereof, and an oxygen-based chemical such as $O_2$, $O_3$, $H_2O$ or other suitable oxygen-containing chemical.

In some embodiments, the pre-layer 450 is a conformal layer formed by an ALD-based deposition process. In such cases, the pre-layer 450 may have a profile that follows the profile of the metal layers 322. FIG. 4D-1 illustrates a cross-sectional view of a portion of the interconnect structure 400 showing the pre-layer 450 formed by an ALD-based deposition process.

Figure 4F:
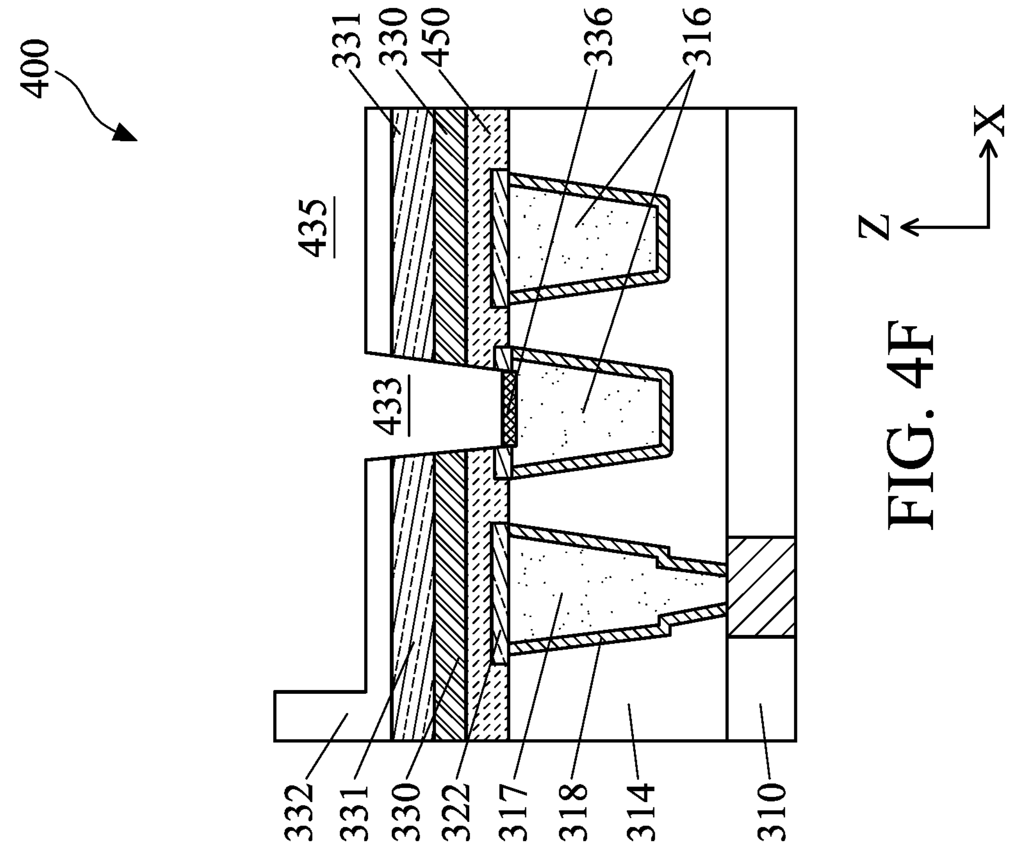
Figure 4E:
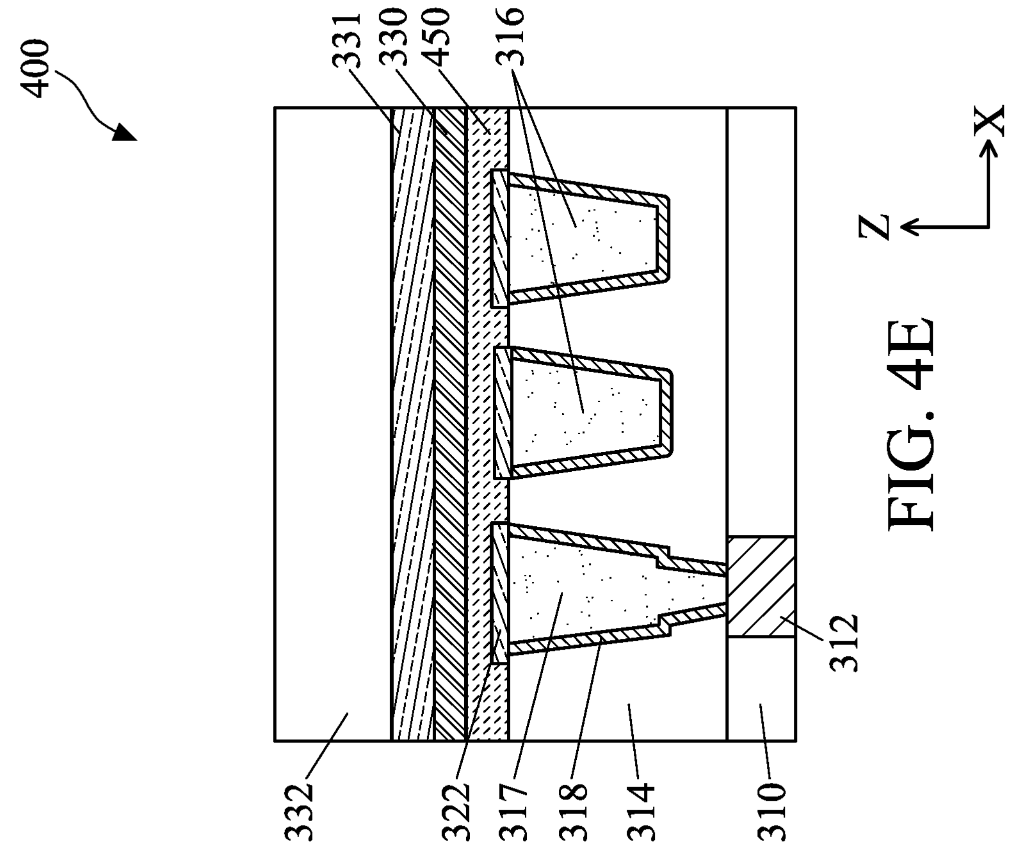

In FIG. 4E, the first etch stop layer 330, the second etch stop layers 331, and the dielectric layer 332 are sequentially formed over the pre-layer 450. The first etch stop layer 330, the second etch stop layers 331, and the dielectric layer 332 may be formed using the similar fashion as discussed above with respect to FIG. 3D.

In FIG. 4F, openings 433, 435 are formed in and through the dielectric layer 332. The opening 435 may be a trench opening formed in an upper portion of the dielectric layer 332. The opening 433 may be a via opening formed through the dielectric layer 332, the second etch stop layer 331, the first etch stop layer 330, the pre-layer 450, and the metal layer 322 to expose a portion of the conductive feature 316. Like the openings 333, 335, the openings 433, 435 are intended to be filled with a conductive material to form conductive features therein. The openings 433, 435 may be a result of a dual-damascene process and may be formed using the same processes for forming the openings 333, 335 as discussed above with respect to FIG. 3F. Thereafter, a blocking layer 336 is selectively formed on the exposed top surface of the conductive feature 316 in a similar fashion as discussed above with respect to FIG. 3F.

Figure 4H:
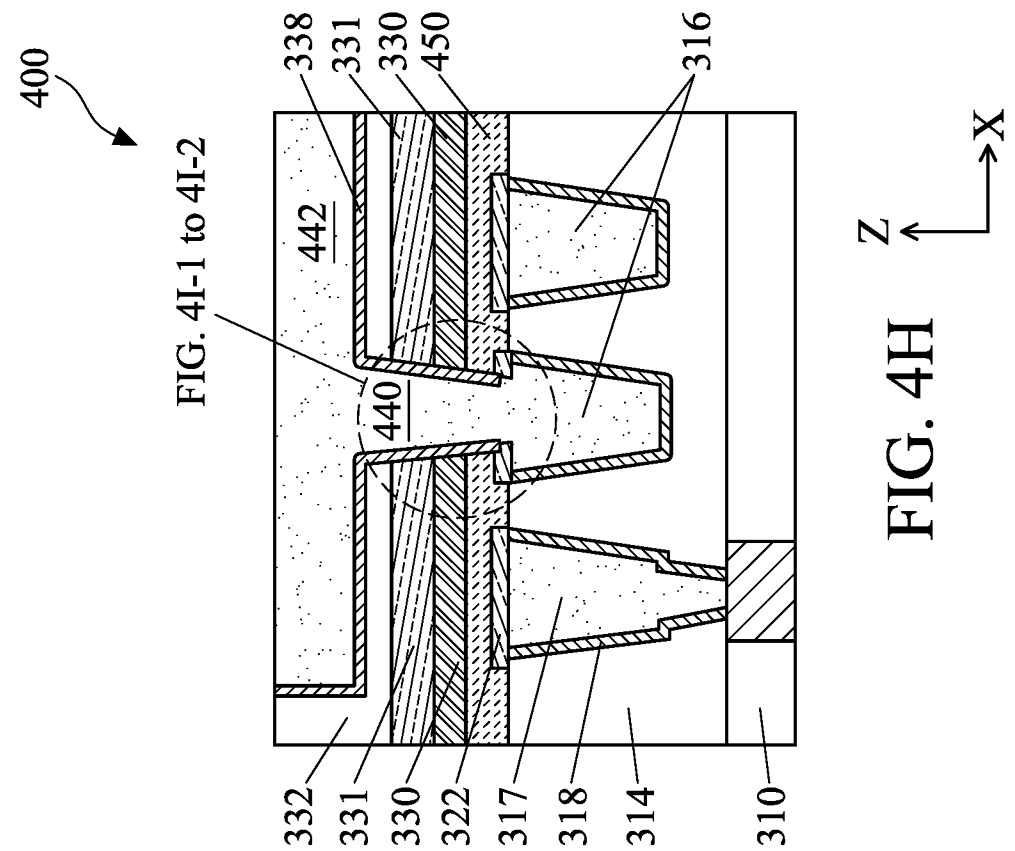
Figure 4G:
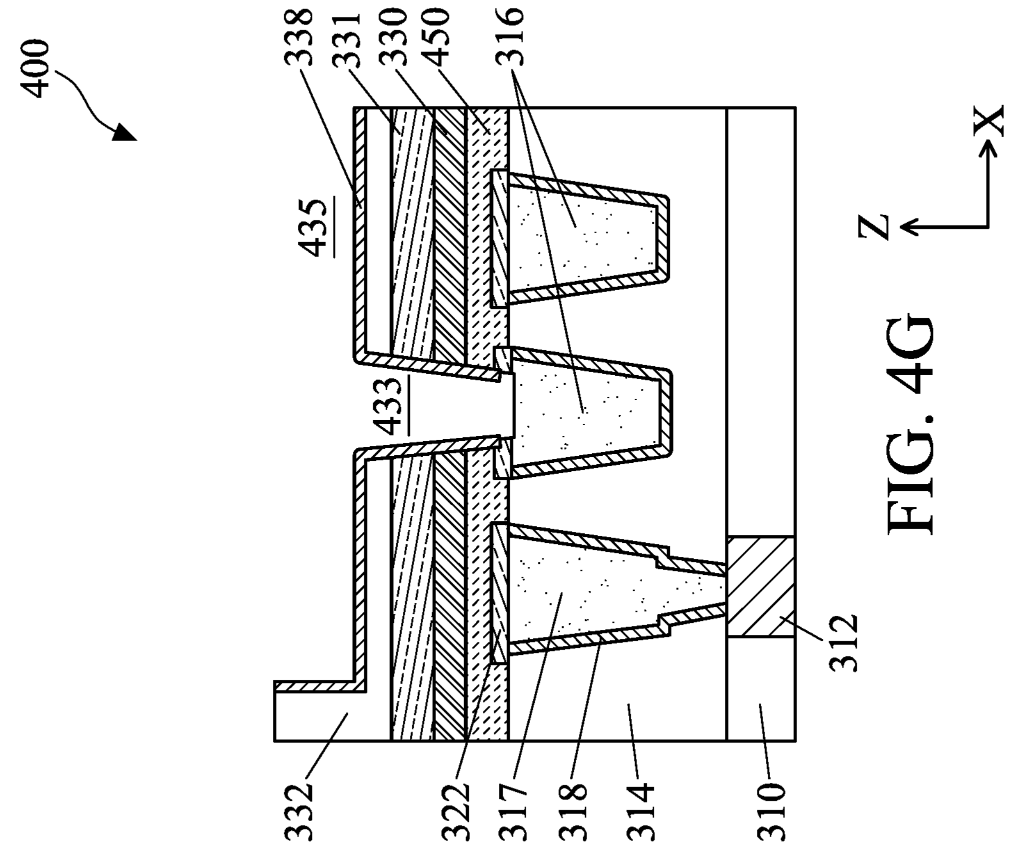

In FIG. 4G, a barrier layer 338 is deposited on exposed dielectric surfaces, such as the dielectric layer 332, the second etch stop layer 331, the first etch stop layer 330, and the pre-layer 450. The barrier layer 338 may include the same material as the dielectric layer 310 and may be formed in a similar fashion as discussed above with respect to FIG. 3G. After the barrier layer 338 is deposited, the blocking layer 336 (FIG. 4F) is removed to expose the top surface of the conductive features 316. The removal process does not substantially affect the barrier layer 338 or the conductive feature 316.

In FIG. 4H, a conductive via 440 and a conductive line 442 are formed in the openings 433, 435 (FIG. 4G), respectively. The conductive via 440 and conductive line 442 may be formed in a similar fashion as those discussed above with respect to FIG. 3H. Likewise, the conductive via 440 may have a first dimension and the conductive line 442 may have a second dimension greater than the first dimension. The conductive via 440 is in direct contact with the underlying conductive features 316 without worrying of unwanted voids due to the formation of the pre-layer 450. The conductive via 440 being in direct contact with the conductive feature 316 may have the lowest electrical resistance due to direct metal to metal contact. In addition, since there is no barrier layer or liner layer between the conductive via 440 and the conductive feature 316, the contact resistance between the conductive via 440 and the conductive feature 316 is reduced. Furthermore, the use of low capacitance material for the first etch stop layer 330 can further reduce the capacitance of damascene BEOL structures to avoid high RC delay.

Figures 1, 4I:
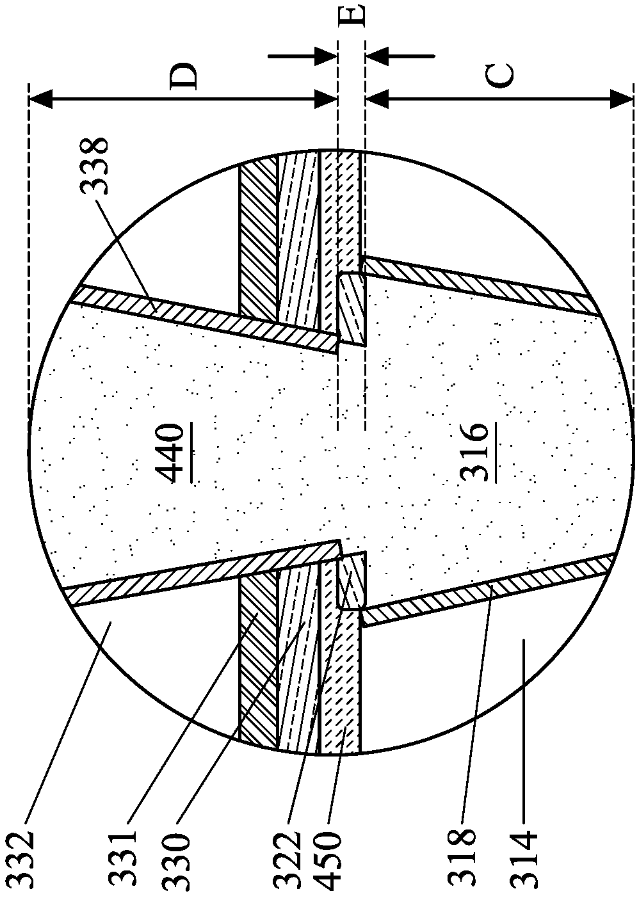
Figures 2, 4I:
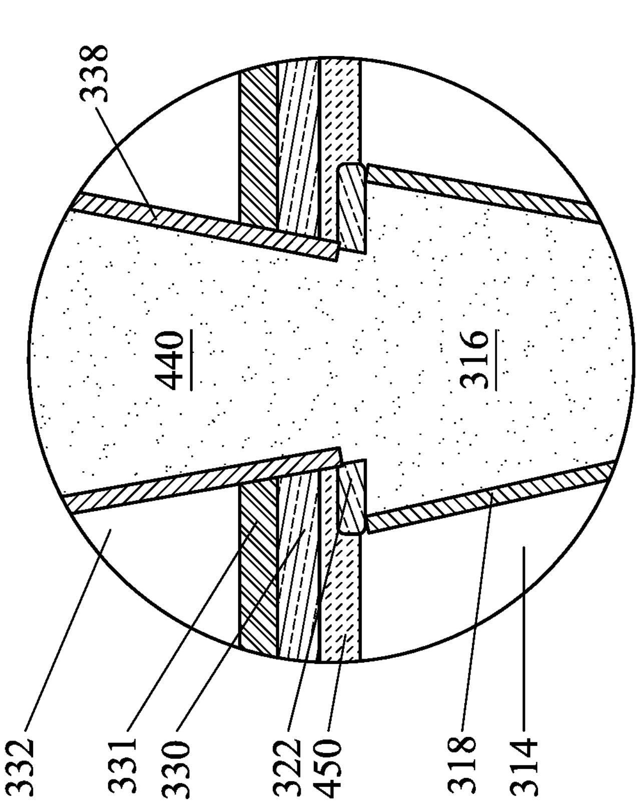

FIGS. 4I-1-4I-2 are enlarged views of a portion of the interconnect structure 400 in accordance with some embodiments. In FIG. 4I-1, the sidewalls of the conductive via 440 and the conductive features 316 may be vertical or slanted. In one embodiment, the conductive via 440 and the conductive feature 316 each has a sidewall profile in which the dimension is gradually decreased along the Z-direction. For example, the dimension at the top of each of the conductive via 440 and the conductive feature 316 is greater than the dimension at the bottom of the conductive via 440 and the conductive feature 316. The conductive via 440 may be considered as having a section D and a section E. The section D has a dimension gradually changing from a first width to a second width. The section E has a dimension gradually changing from a third width to a fourth width. The first width is greater than the second width, the third width is greater than the fourth width. The third width is greater than the second width, and the first width is greater than the fourth width. The conductive feature 316 may be considered as a section C having a dimension gradually changing from a fifth width to a sixth width. The fifth width is greater than the sixth width, and the fifth width is greater than the fourth width. The fifth width may be greater or smaller than the first width.

As shown in FIG. 4I-1, the metal layer 322 is embedded within the pre-layer 450) and in contact with the conductive via 440 and the conductive feature 316. The metal layer 322 is disposed to surround the section E of the conductive via 440 and in contact with a portion of the top surface of the conductive feature 316. The metal layer 322 does not in contact with the barrier layer 318 and the barrier layer 338. The barrier layer 318 is in contact with the conductive feature 316, the dielectric layer 314, and the pre-layer 450. The barrier layer 338 is in contact with the dielectric layer 332, the conductive via 440, the pre-layer 450, the first etch stop layer 330, and the second etch stop layer 331. Depending on the thickness of the blocking layer 336 (FIG. 4F), the barrier layer 338 may be in further contact with the metal layer 322. In some embodiments, the conductive via 440 and the conductive line 442 may include a first conductive material and the conductive feature 316 may include a second conductive material that is different than the first conductive material.

FIG. 4I-2 is substantially identical to the embodiment of FIG. 4I-1 except that the metal layer 322 further extends over and in contact with the barrier layer 318.

Figure 5B:
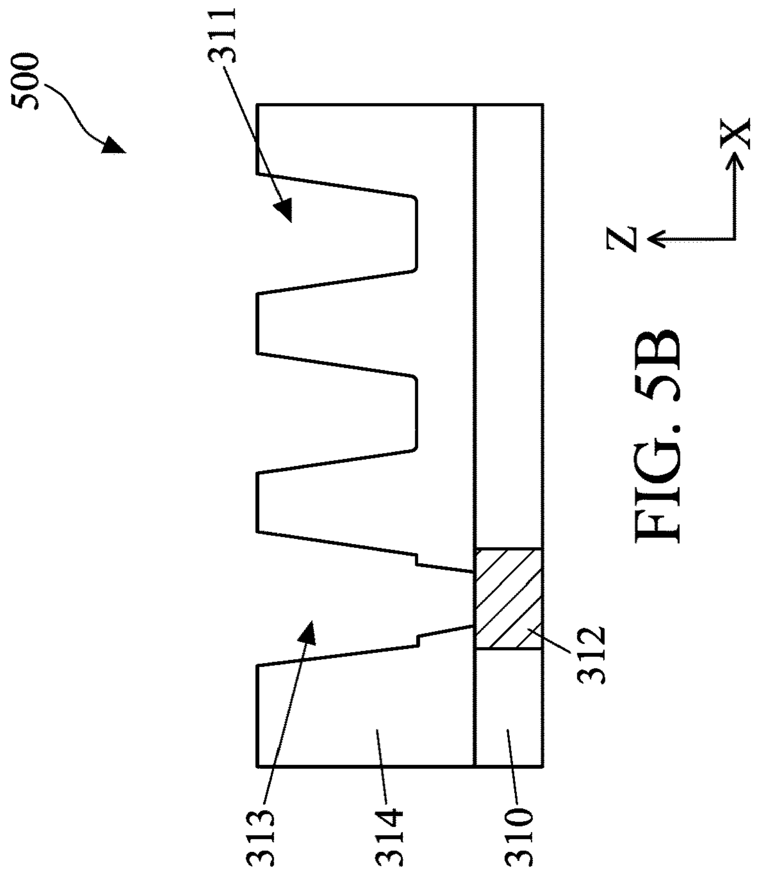
FIGS. 5A-5L are cross-sectional side views of various stages of manufacturing an interconnection structure, in accordance with some embodiments.
Figure 5A:
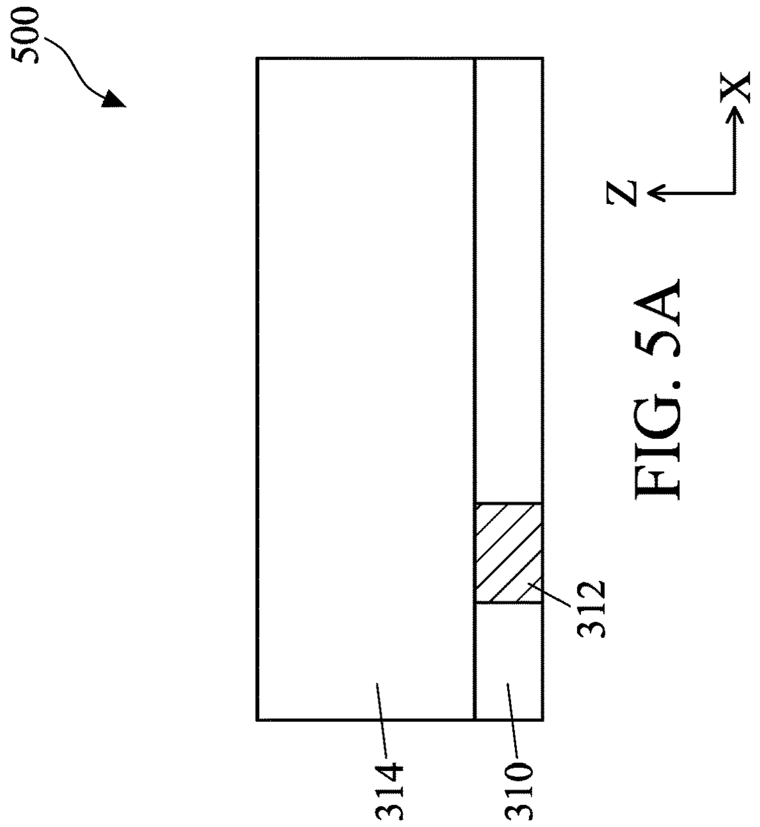
Figure 5D:
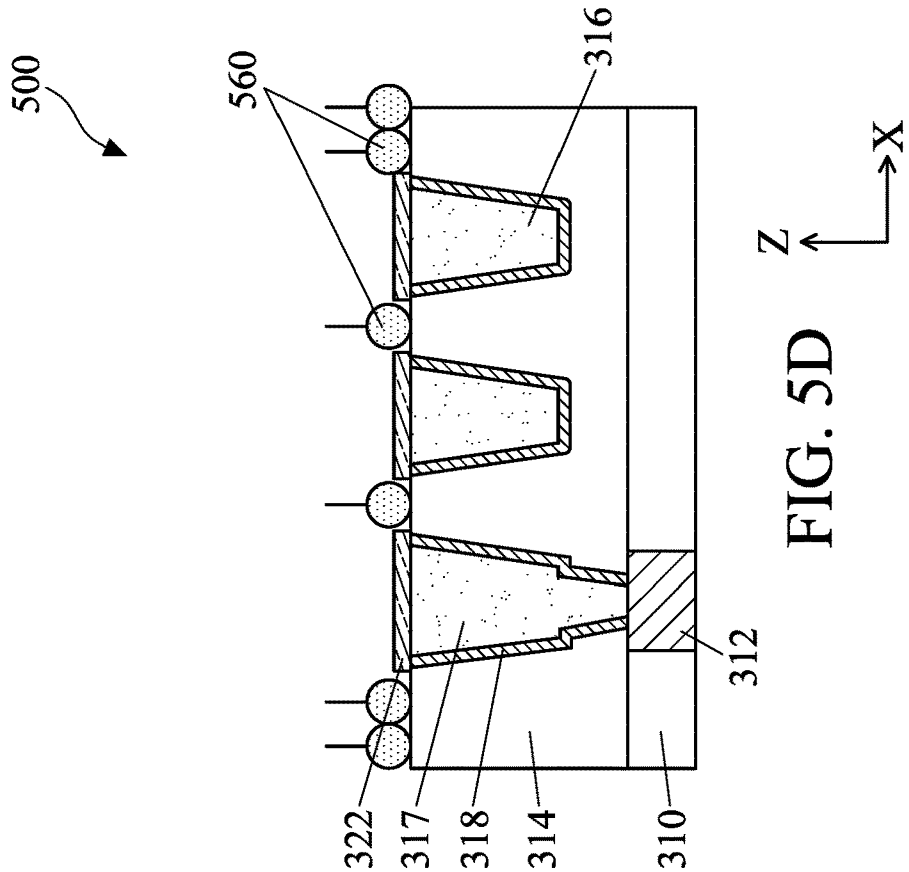
Figure 5C:
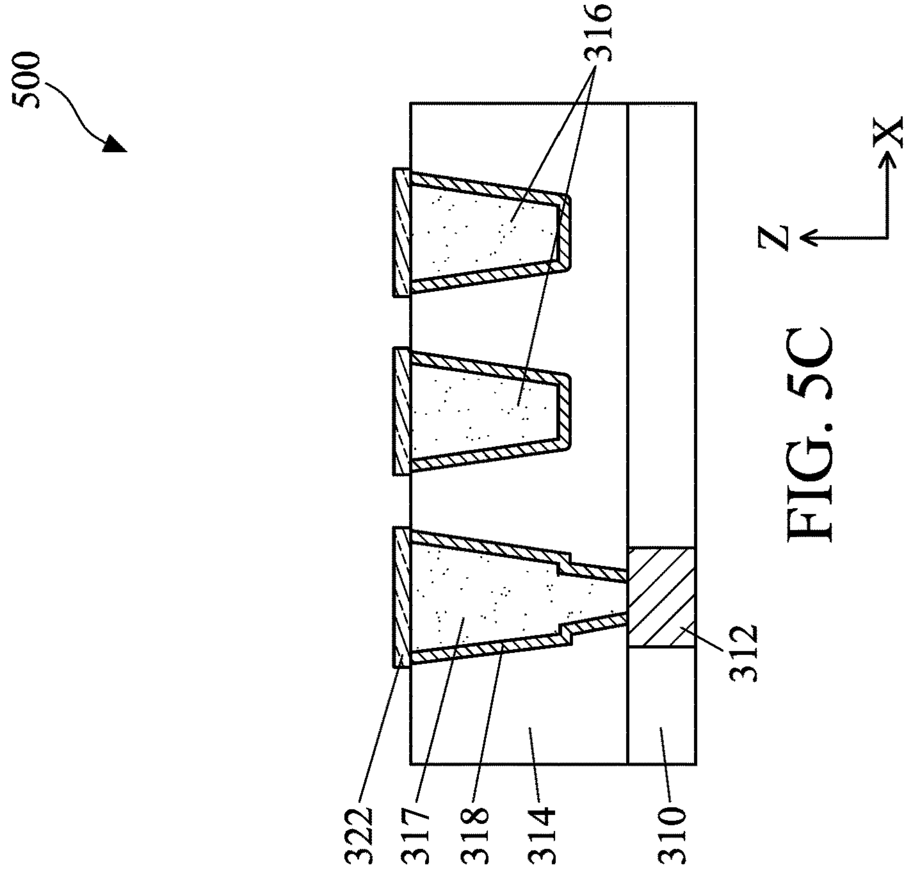
Figures 1, 5D:
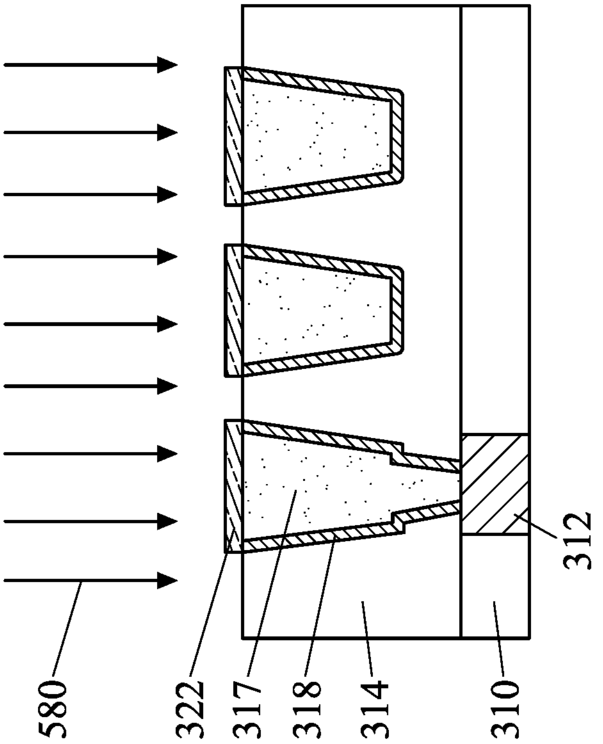
Figures 2, 5D:
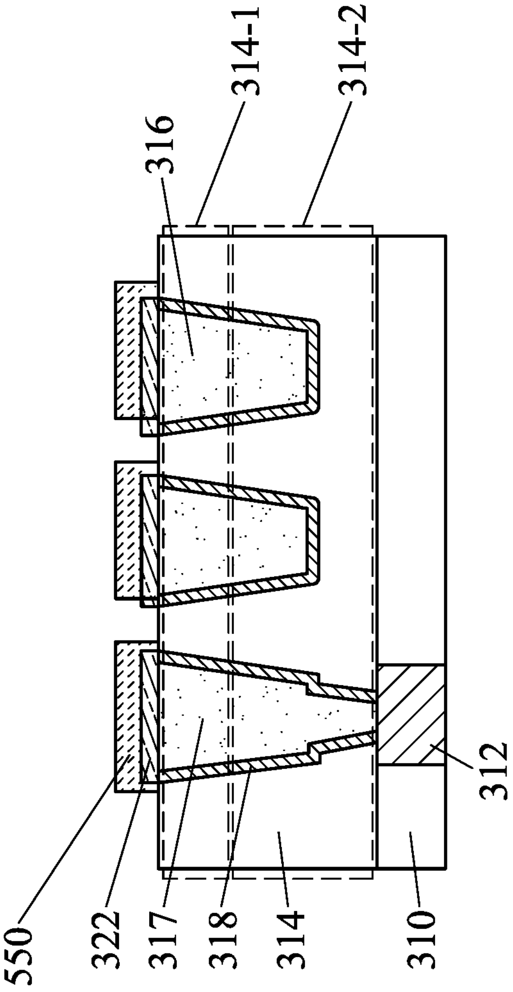

FIGS. 5A-5L are cross-sectional side views of various stages of manufacturing an interconnect structure 500, in accordance with some embodiments. Various embodiments of the interconnect structure 500 may be used to form one or more layers of the interconnect structure 250 shown in FIGS. 1A, 1B and 2. As will be discussed in more detail below, the embodiment shown in FIGS. 5A-5L is similar to the embodiment shown in FIGS. 4A-4H except that the pre-layer is selectively formed between the metal layer 322 and the first etch stop layer 330. The interconnect structure 500 in FIGS. 5A-5C are substantially identical to the interconnect structure 400 shown in FIGS. 4A-4C and therefore are not repeated here for the sake of brevity.

In FIG. 5D, a blocking layer 560 is selectively formed on the exposed surface of the dielectric layer 314. In some embodiments, the blocking layer 560 is formed by molecules with silicon-based functional groups, and therefore the blocking layer 560 is formed on the dielectric layer 314 (e.g., low-k materials), but not on the metal layer 322 (e.g., Co). For example, the blocking layer 560 may include a head group connected to a functional group by way of a molecular chain. The head group is configured to adhere to preferred surfaces such as the surface of the dielectric layer 314 while not adhering to other surfaces such as the surfaces of the metal layer 322. In some embodiments, the head group may include butyltriethoxysilane, cyclohexyltrimethoxysilane, cyclopentyltrimethoxysilane, dodecyltriethoxysilane, dodecyltrimethoxysilane, decyltriethoxysilane, dimethoxy(methyl)-n-octylsilane, triethoxyethylsilane, ethyltrimethoxysilane, hexyltriethoxysilane, hexadecyltrimethoxysilane, hexyltrimethoxysilane, hexadecyltriethoxysilane, triethoxymethylsilane, trimethoxy(methyl)silane, methoxy(dimethyl) octadecylsilane, methoxy(dimethyl)-n-octylsilane, octadecyltriethoxysilane, triethoxy-n-octylsilane, octadecyltrimethoxysilane, trimethoxy(propyl)silane, trimethoxy-n-octylsilane, triethoxy(propyl)silane, methane, ethane, propane, butane, pentane, hexane, heptane, octane, nonane, decane, undecane, dodecane, pentadecane, hexadecane, any combination of the foregoing, or the like. In some embodiments, the functional group may include a hydrophobic interfacial property that repels dielectric material, thereby preventing dielectric material from adhering to the blocking layer 560, in a later dielectric on metal (DoM) process. In some embodiments, the functional group may include a methyl group, which provides the hydrophobic interfacial property. In some embodiments, the blocking layer 560 may be formed by a wet process, such as dip coating, spin coating, spraying coating, or other suitable processes.

Prior to the blocking layer 560, a treatment process may be performed to reduce native oxide on the metallic surfaces of the metal layer 322. The treatment process may be a plasma treatment process utilizing process gases such as hydrogen gas, ammonia, and/or oxygen-containing gas.

Figures 1, 5E:
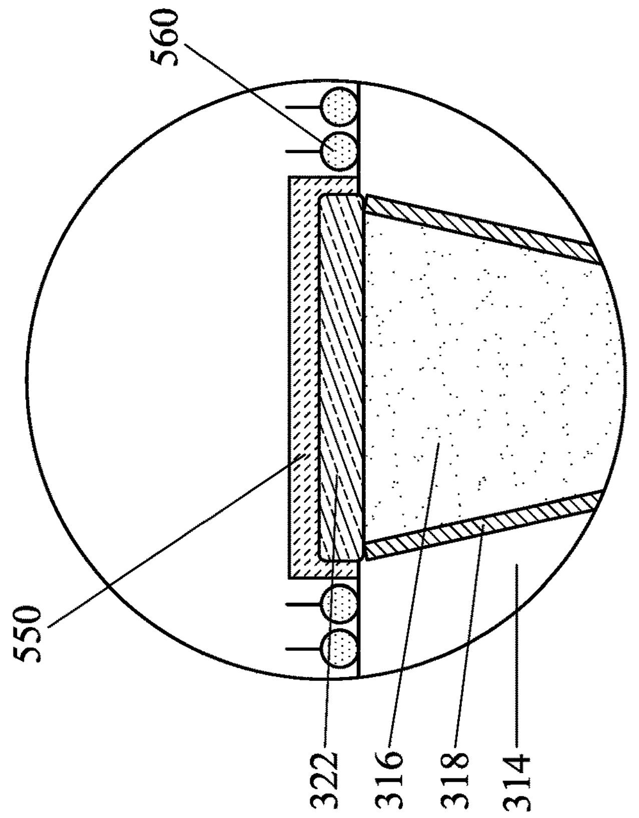
Figure 5E:
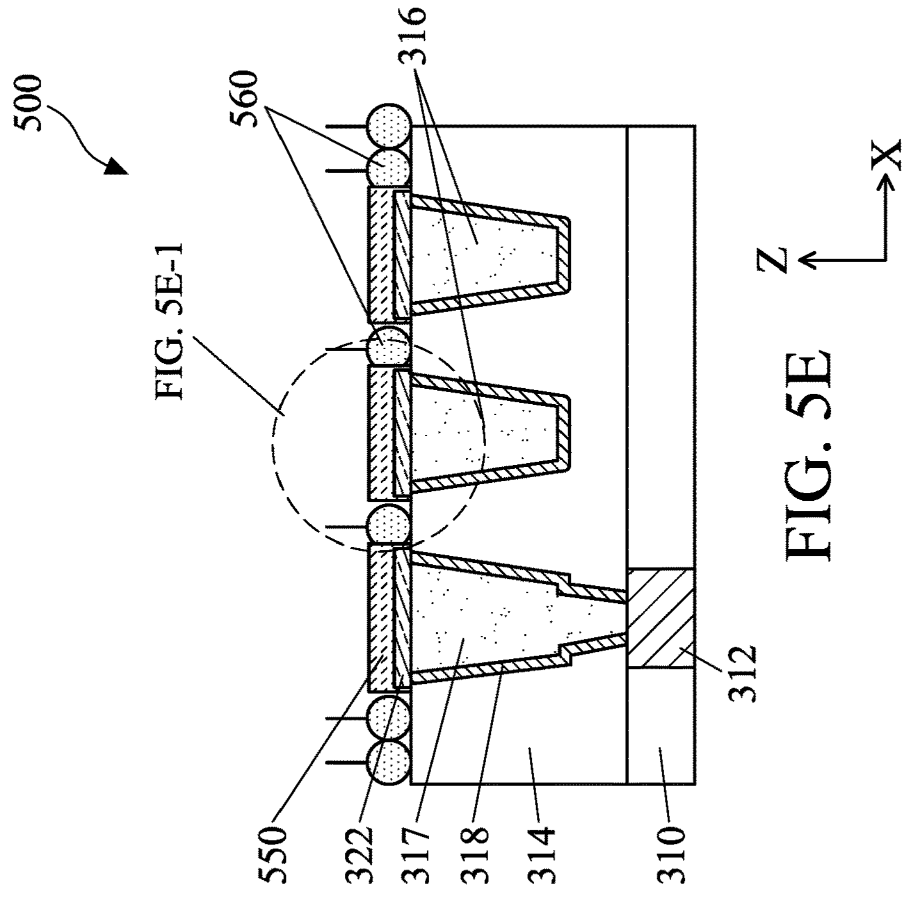
Figures 2, 5E:
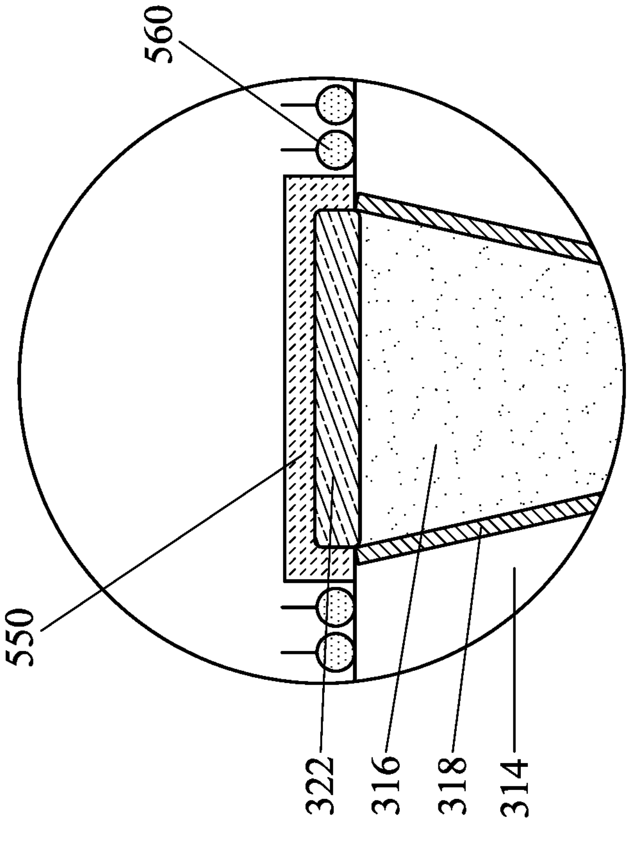

In FIG. 5E, a pre-layer 550 is selectively deposited on the metal layers 322. Due to the presence of the blocking layer 560, the pre-layer 550 is deposited on the exposed surfaces of the metal layers 322 rather than the blocking layer 560, thereby achieving selective deposition of the pre-layer 550 on the metal layers 322. Likewise, the pre-laver 550 serves as a glue layer that improves the adhesion between the first etch stop layer 330 and the metal layer 322. The pre-layer 550 can help remove the voids so that the subsequent conductive features (e.g., conductive via 340) does not land on voids that may otherwise appear at and/or near the metal layer 322 due to poor adhesion, which in turn improves the yield of the device. Compared to the embodiment shown in FIGS. 4A-4H, the capacitance of interconnect structure 500 is further reduced since the pre-layer 550 is selectively deposited on the metal layers 322 and does not extend into regions between the first etch stop layer 330 and the dielectric layer 314.

Like the pre-layer 450, the pre-layer 550 is a nitrogen-rich layer. In some embodiments, the pre-layer 550 may be a nitride of a metal, such as Al, Ti, Zr, Hf, Y, or other suitable metal. In some embodiments, the pre-layer 550 includes a nitride of a semiconductor, such as silicon. The pre-layer 550 may be formed using any suitable process, such as ALD or CVD process. In one embodiment, the pre-layer 550 is deposited using thermal ALD process. In another embodiment, the pre-layer 550 is deposited using thermal CVD process. The thermal ALD or thermal CVD process may be advantageous since it does not damage the blocking layer 560 nor the surface of the dielectric layer 314.

In some embodiments, the pre-layer 550 is a conformal layer deposited by an ALD-based deposition process. In such cases, the pre-layer 550 may have a profile that follows the profile of the metal layers 322. FIG. 5E-1 illustrates a cross-sectional view of a portion of the interconnect structure 500 showing the pre-layer 550 formed by an ALD-based deposition process. The pre-layer 550 is deposited on the top surface and side surfaces of the metal layer 322. In some examples, a portion of the pre-layer 550 is in contact with the dielectric layer 314 but not the barrier layer 318, as shown in FIG. 5E-1. In some examples, a portion of the pre-layer 550 is in contact with the dielectric layer 314 and the barrier layer 318, as shown in FIG. 5E-2. In either case, the thickness of the pre-layer 550 and the thickness of the dielectric layer 314 may be at a ratio of about 1:3 to about 1:15.

Figure 5F:
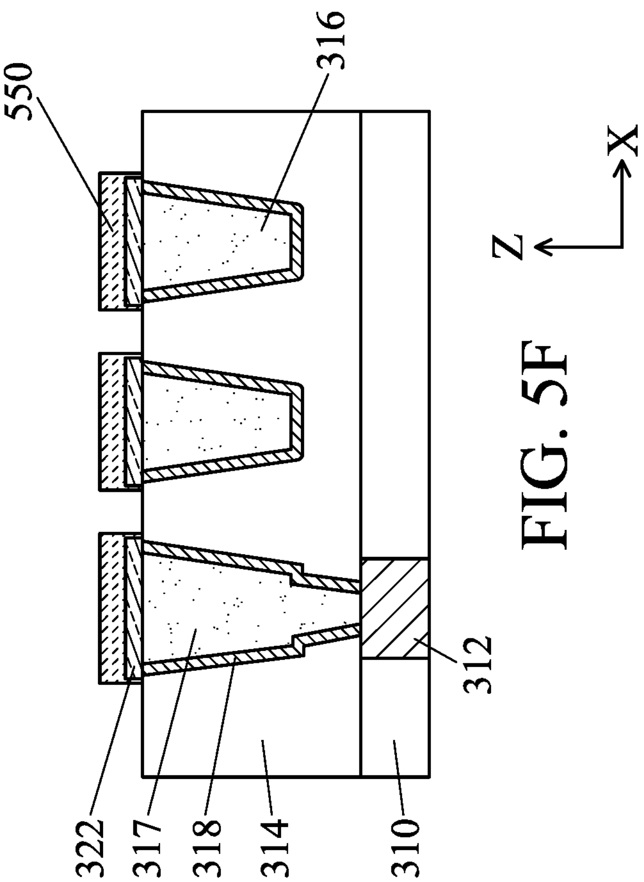

In FIG. 5F, after the pre-layer 550 is deposited, the blocking layer 560 is removed to expose the top surface of the dielectric layer 314. The blocking layer 560 may be removed using thermal degradation or plasma bombardment, or other suitable process. The removal process does not substantially affect the pre-layer 550.

In some alternative embodiments, the selective deposition of the pre-layer 550 on the metal layers 322 is achieved by subjecting the interconnect structure 500 to a treatment process. FIG. 5D-1 illustrates the interconnect structure 500 subjecting to a treatment process 580 according to one embodiment. In one embodiment, the treatment process is a curing process so that at least the dielectric layer 314 is exposed to UV energy in an environment containing hydrogen (e.g., $H_2$) and/or nitrogen (e.g., $NH_3$). In some embodiments, the UV energy may have an energy density ranging from about 10 mJ/cm$^2$ to about 100 J/cm$^2$. During the curing process, the partial pressure of the hydrogen-containing gas or nitrogen-containing gas may be about 30 atmospheric pressure (ATM) or above, such as about 50 ATM or above, and the temperature may be in a range of about 200 degrees Celsius to about 350 degrees Celsius. The treatment process using UV energy enables selective deposition of the subsequent pre-layer 550 because the metal layers 322 is normally pre-treated with plasma to reduce native oxide on the metal layers 322. This plasma pre-treatment may damage the dielectric layer 314 (e.g., SiOCH), leaving low content of —$CH_3$ groups (e.g., Si—$CH_3$ bonds) and high content of oxygen at the surface of the dielectric layer 314. When the surface of the dielectric layer 314 has low content of —$CH_3$ groups, the subsequent pre-layer 550, which is a nitride of a metal or silicon, tends to absorb onto the dielectric layer 314. The use of UV energy not only reduces native oxide to metal but also help keep —$CH_3$ groups (e.g., Si—$CH_3$ bonds) at the surface of the dielectric layer 314. The high concentration of —$CH_3$ groups at the surface of the dielectric layer 314 can prevent the precursor (for forming the subsequent pre-layer 550) from absorbing onto the dielectric layer 314, resulting in selective deposition of the pre-layer 550 on the metal layers 322. FIG. 5D-2 illustrates a stage after the pre-layer 550 is formed on the metal layers 322, in which the UV-treated dielectric layer 314 includes a first (upper) region 314-1 having a first concentration of —$CH_3$ groups and a second region (lower) 314-2 having a second concentration of —$CH_3$ groups lower than the first concentration of —$CH_3$ groups.

Figure 5H:
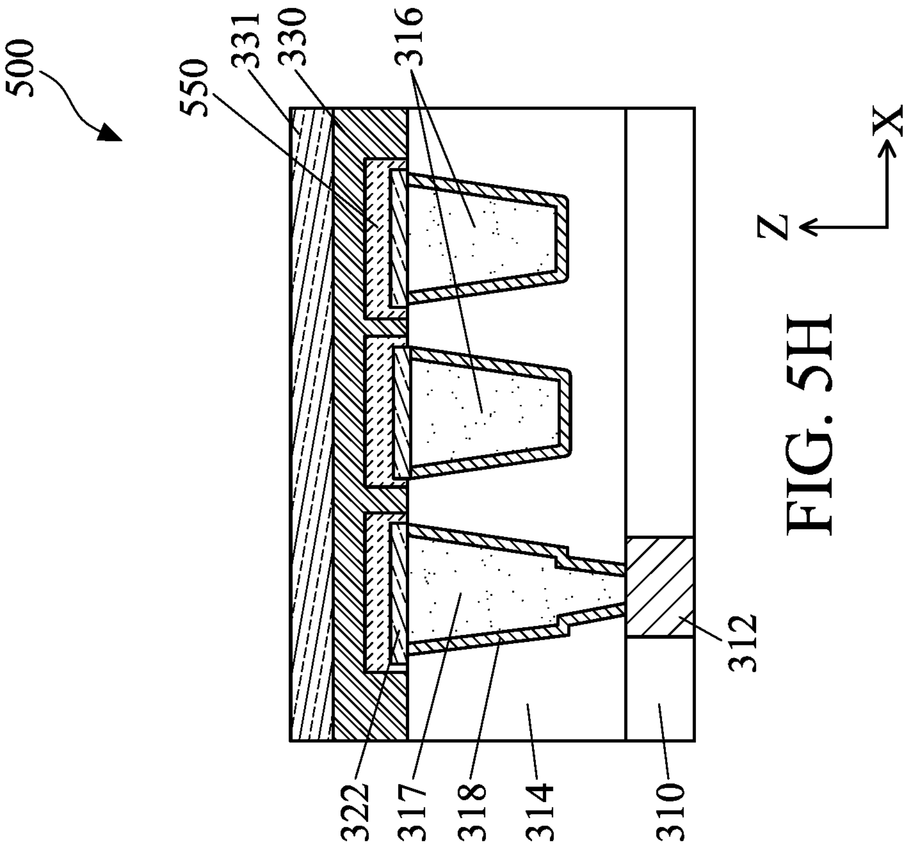
Figure 5G:
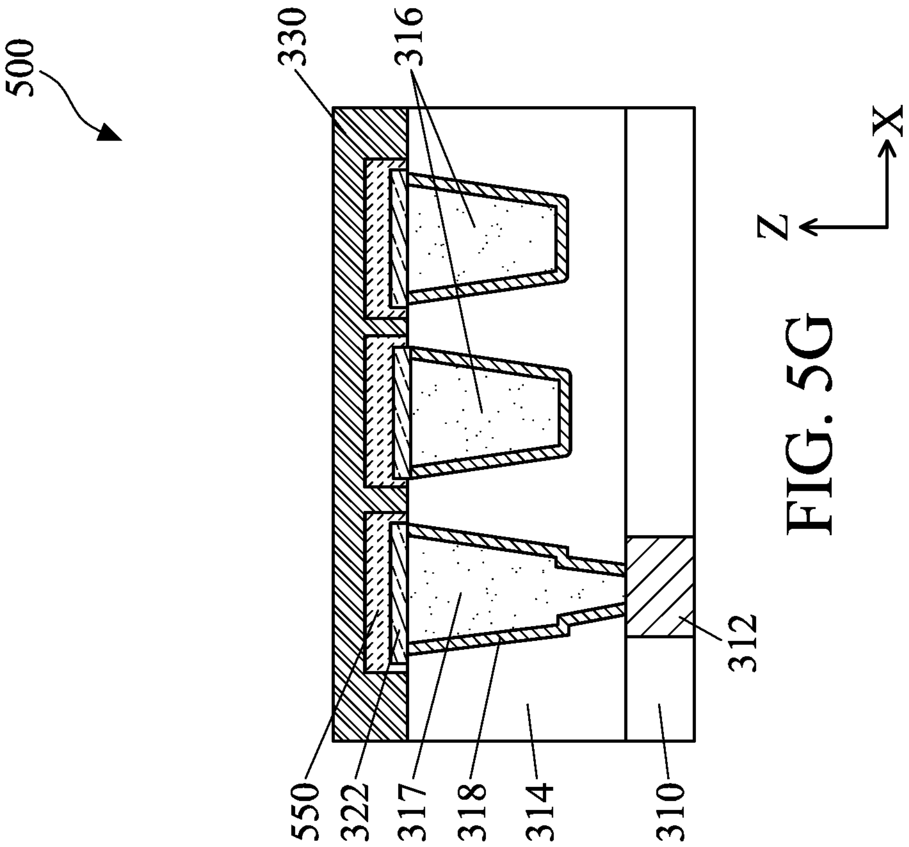

In FIG. 5G, the interconnect structure 500 is subjected to an optional pre-treatment process. In some embodiments where the blocking layer 560 is used, the pre-treatment process is the same process used for removing the blocking layer 560. In some embodiments, the pre-treatment process is a plasma treatment using a hydrogen-containing gas and an inert gas such as argon or nitrogen. Additionally or alternatively, the plasma treatment may be performed using a carbon-containing gas such as $CH_x$ (with x being an integer such as 1, 2, or 4), $CO_2$, or the like. During the pre-treatment process, the interconnect structure 500 may be heated to a temperature in a range of about 200 degrees Celsius to about 450 degrees Celsius. Alternatively, the pre-treatment may be thermal-based and is performed without turning on plasma.

In FIGS. 5G, 5H and 51, after the pre-treatment process, the first etch stop layer 330, the second etch stop layers 331, and the dielectric layer 332 are sequentially formed over the pre-layer 450. The first etch stop layer 330, the second etch stop layers 331, and the dielectric layer 332 may be formed using the similar fashion as discussed above with respect to FIG. 3D.

Figure 5J:
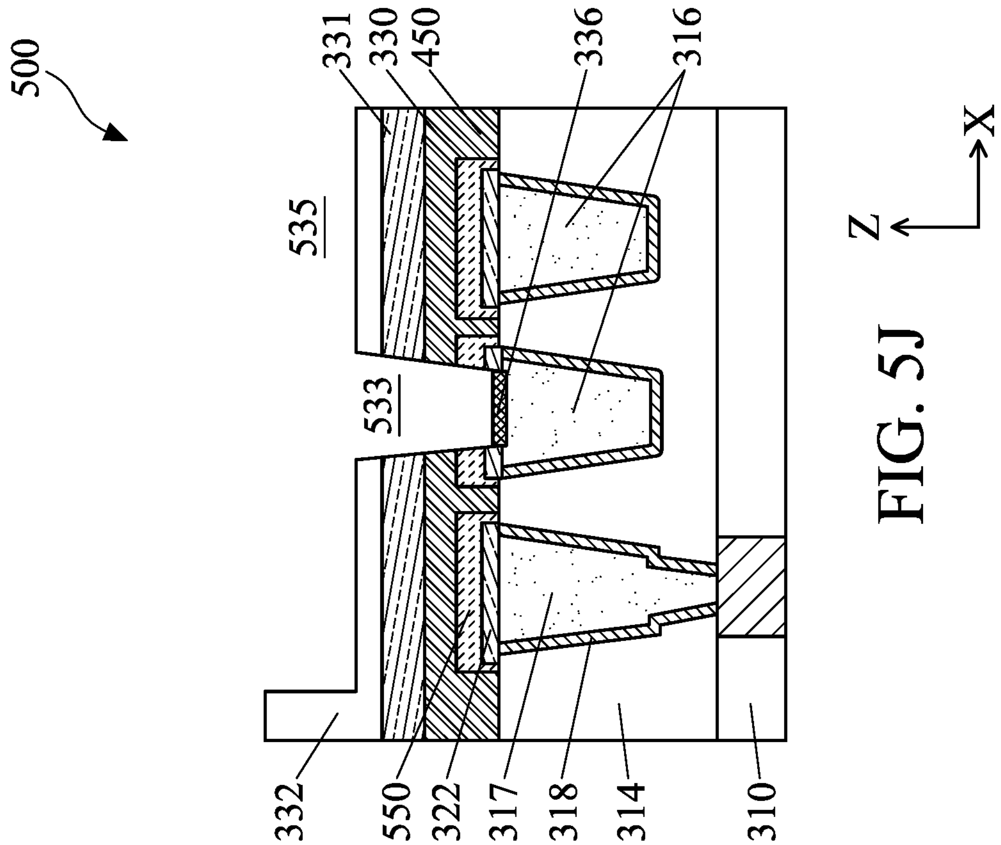
Figure 5I:
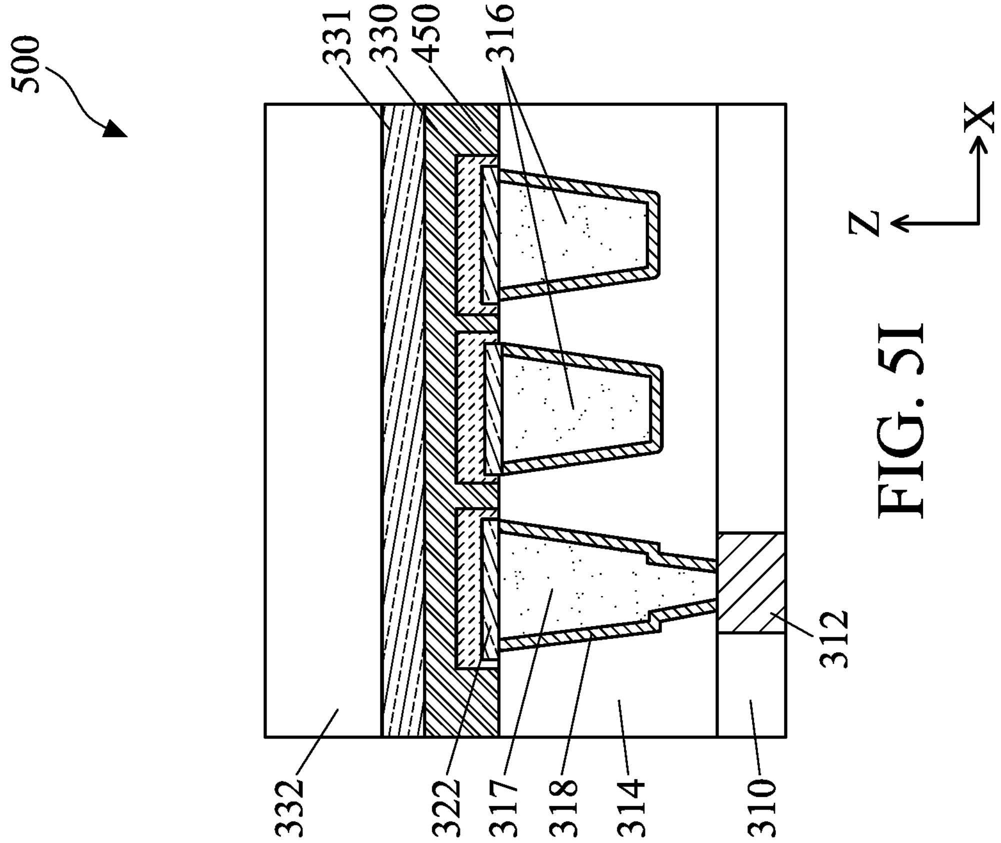

In FIG. 5J, openings 533, 535 are formed in and through the dielectric layer 332. The opening 535 may be a trench opening formed in an upper portion of the dielectric layer 332. The opening 533 may be a via opening formed through the dielectric layer 332, the second etch stop layer 331, the first etch stop layer 330, the pre-layer 550, and the metal layer 322 to expose a portion of the conductive feature 316. Like the openings 333, 335, the openings 533, 535 are intended to be filled with a conductive material to form conductive features therein. The openings 533, 535 may be a result of a dual-damascene process and may be formed using the same processes for forming the openings 333, 335 as discussed above with respect to FIG. 3F. Thereafter, a blocking layer 336 is selectively formed on the exposed top surface of the conductive feature 316 in a similar fashion as discussed above with respect to FIG. 3F.

Figure 5L:
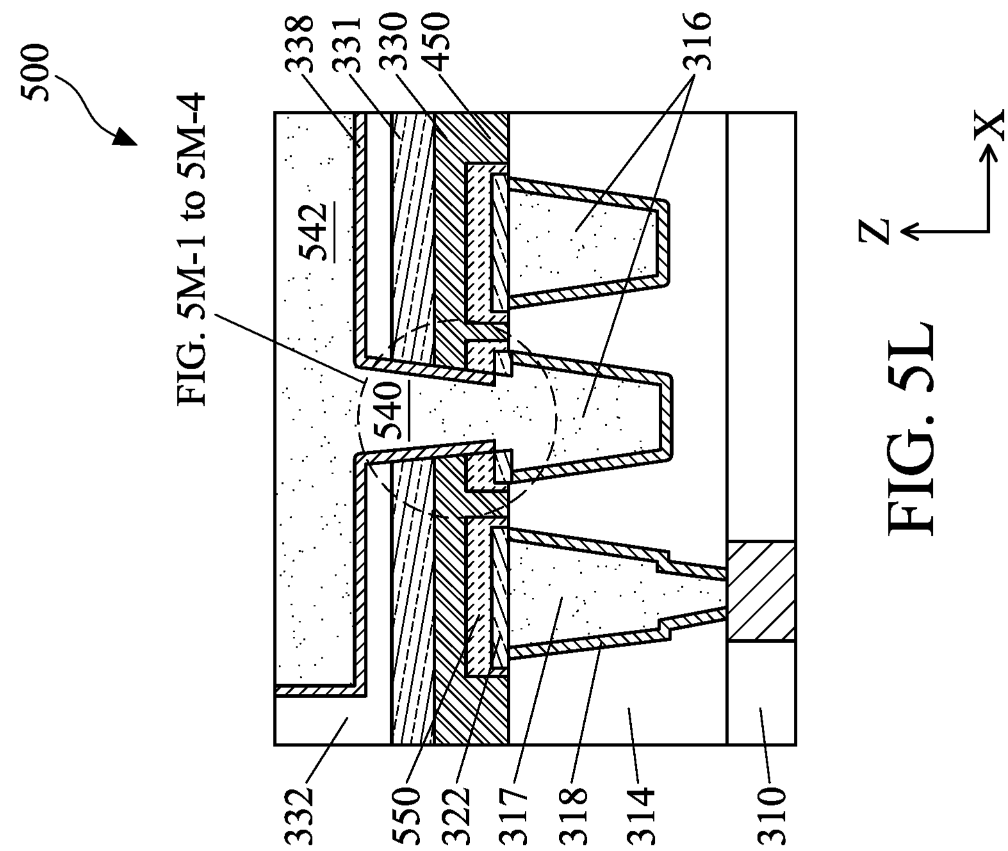
Figure 5K:
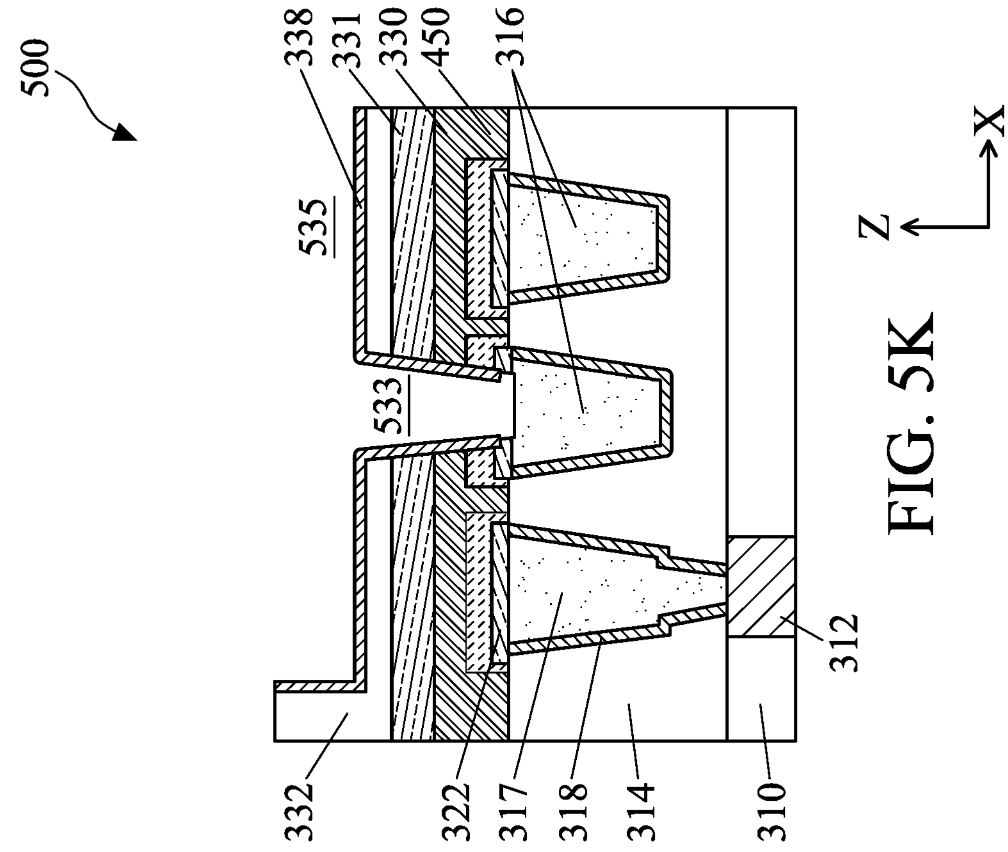

In FIG. 5K, a barrier layer 338 is deposited on exposed dielectric surfaces, such as the dielectric layer 332, the second etch stop layer 331, the first etch stop layer 330, and the pre-layer 550. Depending on the thickness of the blocking layer 336, the barrier layer 338 may be in further contact with the metal layer 322. The barrier layer 338 may include the same material as the dielectric layer 310 and may be formed in a similar fashion as discussed above with respect to FIG. 3G. After the barrier layer 338 is deposited, the blocking layer 336 (FIG. 5J) is removed to expose the top surface of the conductive features 316. The removal process does not substantially affect the barrier layer 338 or the conductive feature 316.

In FIG. 5L, a conductive via 540 and a conductive line 542 are formed in the openings 533, 535 (FIG. 5K), respectively. The conductive via 540 and conductive line 542 may be formed in a similar fashion as those discussed above with respect to FIG. 3H. The conductive via 540 is in direct contact with the underlying conductive features 316 without worrying of unwanted voids due to the formation of the pre-layer 550. Particularly, the pre-layer 550 is selectively deposited on the metal layers 322 and does not extend into regions between the first etch stop layer 330 and the dielectric layer 314 for greater reduction of the capacitance of interconnect structure 500. The conductive via 540 being in direct contact with the conductive feature 316 may have the lowest electrical resistance due to direct metal to metal contact. In addition, since there is no barrier layer or liner layer between the conductive via 540 and the conductive feature 316, the contact resistance between the conductive via 540 and the conductive feature 316 is reduced. Furthermore, the use of low capacitance material for the first etch stop layer 330 can further reduce the capacitance of damascene BEOL structures to avoid high RC delay.

Figures 1, 5M:
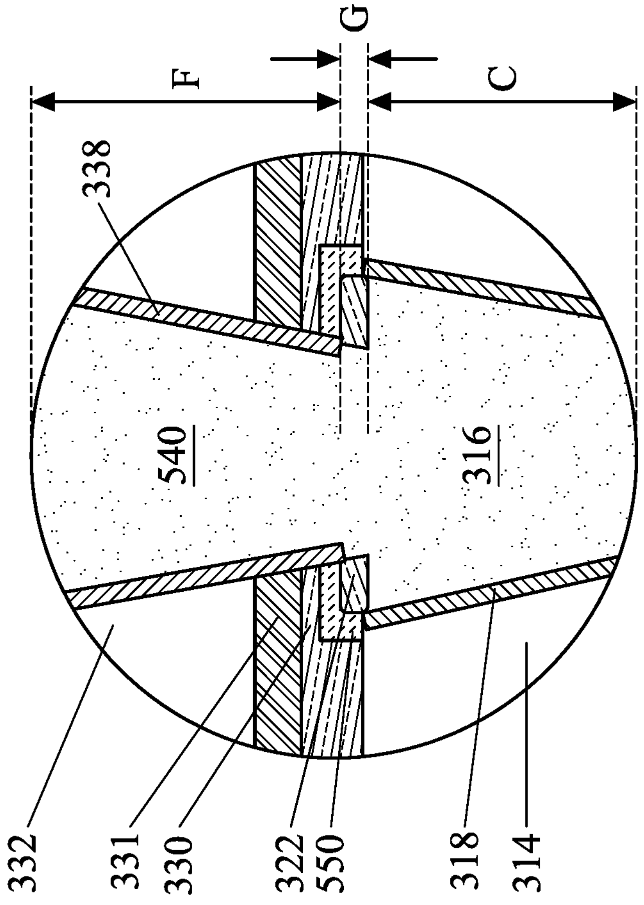
Figures 2, 5M:
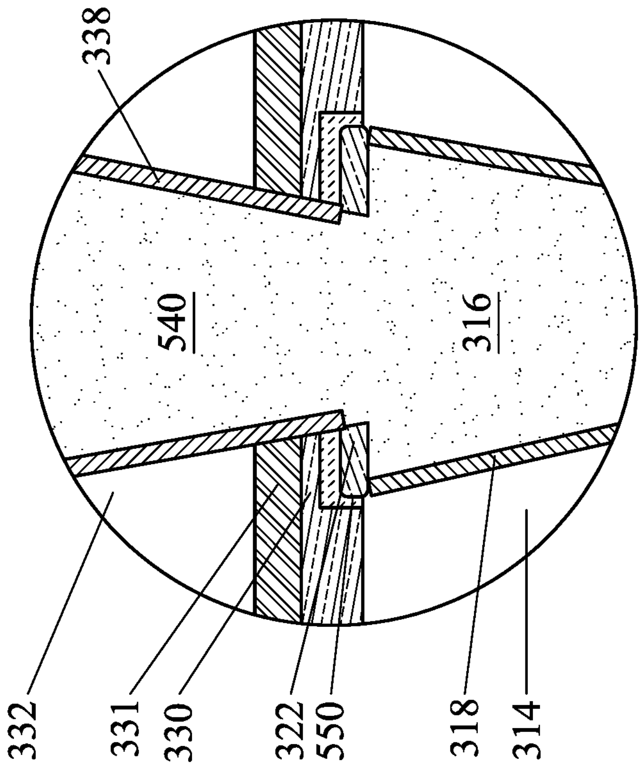
Figures 3, 5M:
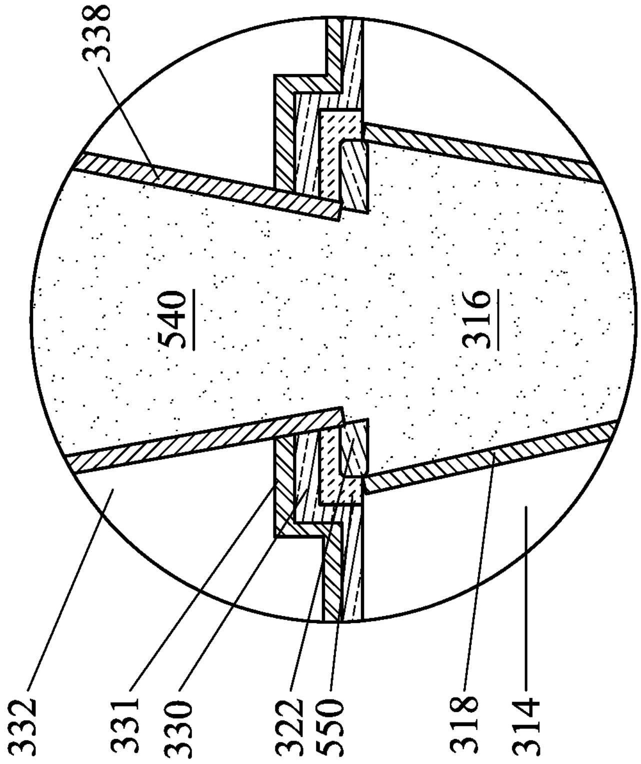
Figures 4, 5M:
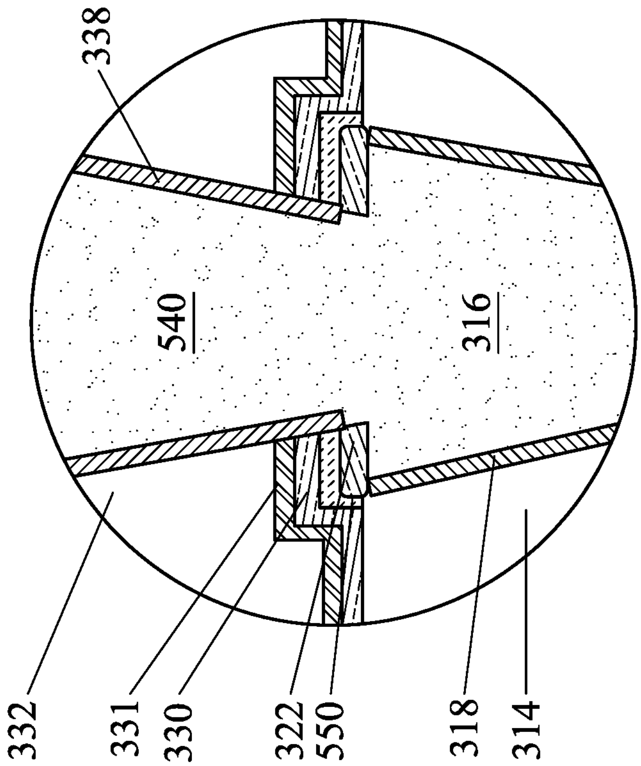

FIGS. 5M-1-5M-4 are enlarged views of a portion of the interconnect structure 500 in accordance with some embodiments. In FIG. 5M-1, the sidewalls of the conductive via 540 and the conductive features 316 may be vertical or slanted. In one embodiment, the conductive via 540 and the conductive feature 316 each has a sidewall profile in which the dimension is gradually decreased along the Z-direction. For example, the dimension at the top of each of the conductive via 540 and the conductive feature 316 is greater than the dimension at the bottom of the conductive via 540 and the conductive feature 316. The conductive via 540 may be considered as having a section F and a section G. The section F has a dimension gradually changing from a first width to a second width. The section G has a dimension gradually changing from a third width to a fourth width. The first width is greater than the second width, the third width is greater than the fourth width. The third width is greater than the second width, and the first width is greater than the fourth width. The conductive feature 316 may be considered as a section C having a dimension gradually changing from a fifth width to a sixth width. The fifth width is greater than the sixth width, and the fifth width is greater than the fourth width. The fifth width may be greater or smaller than the first width.

As shown in FIG. 5M-1, the metal layer 322 is embedded within the pre-layer 550) and in contact with the conductive via 540 and the conductive feature 316. The metal layer 322 is disposed to surround the section G of the conductive via 540 and in contact with a portion of the top surface of the conductive feature 316. The metal layer 322 does not in contact with the barrier layer 318 and the barrier layer 338. The barrier layer 318 is in contact with the conductive feature 316, the dielectric layer 314, and the pre-layer 550. The barrier layer 338 is in contact with the dielectric layer 332, the conductive via 340, the first etch stop layer 330, and the second etch stop layer 331. Depending on the thickness of the blocking layer 336 (FIG. 5J), the barrier layer 338 may be in further contact with the metal layer 322. The first etch stop layer 330 is disposed between and in contact with the dielectric layer 314 and the second etch stop layer 331. In some embodiments, the conductive via 340 and the conductive line 342 may include a first conductive material and the conductive feature 316 may include a second conductive material that is different than the first conductive material.

FIG. 5M-2 is substantially identical to the embodiment of FIG. 5M-1 except that the metal layer 322 further extends over and in contact with the barrier layer 318. FIGS. 5M-3 and 5M-4 are substantially identical to the embodiments of FIGS. 5M-1 and 5M-2 except that portions of the first etch stop layer 330 and the second etch stop layer 331 follow the profile of the pre-layer 550.

Some embodiments relate to interconnect structures with reduced contact resistance and reduced RC delay. Embodiments of the present disclosure provide barrier-free conductive via structures in direct contact with conductive lines. The conductive via structures extend through a first etch stop layer (which is a metal free material and has a low capacitance value), and a second etch stop layer (which is a metal free material and has a low k value), and a metal layer. Particularly, a pre-layer layer, which is a nitrogen-rich metal nitride or silicon nitride, is disposed between the metal layer and the first etch stop layer to improve adhesion and prevent voids from forming between the first etch stop layer and the metal layer. With the use of the pre-layer, the conductive via structures do not land on the voids that may otherwise appear at and/or near the metal layer due to poor adhesion. As a result, the yield of the interconnect structure is improved.

A method for forming a semiconductor device structure is disclosed. The method includes forming one or more first conductive features in a first dielectric layer, forming a metal layer on each of the one or more first conductive features, forming a first etch stop layer over the metal layer, forming a second etch stop layer on the first etch stop layer, wherein the second etch stop layer is a nitrogen-free layer. The method also includes forming a second dielectric layer on the second etch stop layer, and forming a second conductive feature in the second dielectric layer through the second etch stop layer, the first etch stop layer, and the metal layer.

Another embodiment is a method for forming a semiconductor device structure. The method includes forming one or more first conductive features in a dielectric layer, forming a metal layer on each of the one or more first conductive features, selectively forming a blocking layer on exposed surface of the dielectric layer, selectively forming a pre-layer on the metal layers, removing the blocking layer, covering exposed surfaces of the pre-layer with a first etch stop so that a portion of the first etch stop layer is in contact with the dielectric layer, and forming a second etch stop layer on the first etch stop layer.

A further embodiment is an interconnect structure. The structure includes a first dielectric layer, a second dielectric layer disposed above the first dielectric layer, a metal layer disposed between the first and second dielectric layers, a pre-layer disposed on the metal layer and between the first and second dielectric layers, wherein the pre-layer is in contact with a top surface and sidewalls of the metal layer. The interconnect structure also includes a first etch stop layer disposed on the pre-layer and between the first and second dielectric layers, a second etch stop layer disposed on the first etch stop layer and between the first and second dielectric layers, wherein the second etch stop layer is a metal-free layer, and a conductive feature extending from the first dielectric layer to the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:
- forming one or more first conductive features in a first dielectric layer;
- forming a metal layer on each of the one or more first conductive features;
- forming a pre-layer on the metal layer by:
  - selectively depositing a blocking layer on the first barrier layer and the first dielectric layer;
  - forming the pre-layer on exposed surfaces of the metal layer; and
  - after forming the pre-layer, removing the blocking layer;
- forming a first etch stop layer over the metal layer;
- forming a second etch stop layer on the first etch stop layer, wherein the second etch stop layer is a nitrogen-free layer;
- forming a second dielectric layer on the second etch stop layer; and
- forming a second conductive feature in the second dielectric layer through the second etch stop layer, the first etch stop layer, and the metal layer.

2. The method of claim 1, further comprising:
- forming a first barrier layer between the one or more first conductive features and the first dielectric layer.

3. The method of claim 2, wherein the pre-layer is extended to cover on exposed surfaces of the metal layer, the first barrier layer, and the first dielectric layer.

4. The method of claim 1, wherein forming a pre-layer further comprises:
- subjecting at least the first dielectric layer to UV energy.

5. The method of claim 4, wherein the UV energy is performed in an environment containing hydrogen and/or nitrogen.

6. The method of claim 5, wherein the hydrogen and/or nitrogen have a partial pressure of about 30 atmospheric pressure (ATM) or above.

7. The method of claim 1, wherein the second conductive feature is disposed through the second etch stop layer, the first etch stop layer, the pre-layer, and the metal layer.

8. The method of claim 7, further comprising:
- forming a second barrier layer, wherein the second barrier layer extends between and in contact with the second conductive feature, the second dielectric layer, the second etch stop layer, the first etch stop layer, and the pre-layer.

9. The method of claim 1, wherein the first etch stop layer is a metal-free layer.

10. The method of claim 1, wherein the pre-layer has a non-uniform nitrogen concentration along a thickness direction.

11. A method for forming a semiconductor device structure, comprising:
- forming one or more first conductive features in a first dielectric layer;
- forming a metal layer on each of the one or more first conductive features;
- subjecting the semiconductor device structure to a pre-treatment process to form first and second regions in the first dielectric layer, the first region having a first surface characteristic and the second region having a second surface characteristic that is different than the first surface characteristic, wherein the first region has a first concentration of —CH3 groups and the second region has a second concentration of —CH3 groups lower the first concentration of —CH3 groups;
- selectively forming a pre-layer on the metal layers;
- covering exposed surfaces of the pre-layer with a first etch stop so that a portion of the first etch stop layer is in contact with the first dielectric layer; and
- forming a second etch stop layer on the first etch stop layer.

12. The method of claim 11, wherein the pre-treatment process is performed by exposing the semiconductor device structure to a UV curing process in an environment containing hydrogen and/or nitrogen.

13. The method of claim 11, further comprising:
- forming a first barrier layer in contact with a sidewall surface of each first conductive feature.

14. The method of claim 13, wherein the metal layer is formed to cover a top of the first barrier layer.

15. The method of claim 13, wherein a portion of the pre-layer is in contact with a top of the first barrier layer.

16. The method of claim 11, wherein the pre-layer has a nitrogen content in a range of about 40 at. % to about 80 at. %.

17. The method of claim 16, further comprising:
- forming a second dielectric layer on the second etch stop layer;
- forming a second conductive feature in the second dielectric layer through the second etch stop layer, the first etch stop layer, the pre-layer, and the metal layer; and
- forming a second barrier layer between the second dielectric layer and the second conductive feature, wherein the second barrier layer is in contact with the first conductive feature.

18. A method for forming a semiconductor device structure, comprising:
- forming a metal layer on one or more first conductive features in a first dielectric layer;
- forming a pre-layer on the metal layers and the first dielectric layer;
- forming a first etch stop layer on the pre-layer;
- forming a second etch stop layer on the first etch stop layer;
- forming a second dielectric layer on the second etch stop layer;

forming an opening through the second dielectric layer, the second etch stop layer, the first etch stop layer, the pre-layer, and a portion of the metal layer to expose at least one first conductive feature;

selectively forming a blocking layer on exposed surface of the first conductive features;

forming a barrier layer on exposed surfaces of the opening without covering the metal layer and the first conductive feature; and filling the opening to form a second conductive feature.

19. The method of claim 18, wherein the pre-layer has a nitrogen content in a range of about 40 at. % to about 80 at. %.

20. The method of claim 18, wherein forming the pre-layer further comprising subjecting at least the first dielectric layer to UV energy.

* * * * *